United States Patent
Honda

(10) Patent No.: US 7,924,620 B2
(45) Date of Patent: Apr. 12, 2011

(54) NONVOLATILE SEMICONDUCTOR MEMORY INCLUDING CHARGE ACCUMULATION LAYER AND CONTROL GATE

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/543,161

(22) Filed: Aug. 18, 2009

(65) Prior Publication Data

US 2010/0214842 A1    Aug. 26, 2010

(51) Int. Cl.
*G11C 16/00* (2006.01)

(52) U.S. Cl. ......... 365/185.18; 365/185.17; 365/185.23; 365/185.27; 365/185.28

(58) Field of Classification Search ............... 365/185.02
See application file for complete search history.

(56) References Cited

U.S. PATENT DOCUMENTS

| | | | | |
|---|---|---|---|---|
| 5,414,665 A | * | 5/1995 | Kodama | 365/185.06 |
| 7,009,881 B2 | * | 3/2006 | Noguchi | 365/185.17 |
| 7,738,298 B2 | * | 6/2010 | Chae et al. | 365/185.17 |

FOREIGN PATENT DOCUMENTS

| | | |
|---|---|---|
| JP | 2002-245785 | 8/2002 |
| JP | 2007-226897 | 9/2007 |
| JP | 2008-204545 | 9/2008 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory includes a transistor, a first MOS, a second MOS, a first voltage circuit, and a second voltage circuit. The transistor includes a accumulation layer, a control gate, and a first impurity diffused layer. The first MOS includes a first electrode and a second layer. The second MOS includes a second electrode and a third layer, after the channels being formed, the first MOS and the second MOS being cut off. The first voltage circuit applies a first voltage to an active region to generate a forward bias. The second voltage circuit applies a second voltage, and a third voltage to the control gate of the transistor, after the first voltage circuit charges the first to third impurity diffused layer to the first voltage, the second voltage circuit applying the second voltage and the third voltage to the control gate of the transistor.

20 Claims, 9 Drawing Sheets

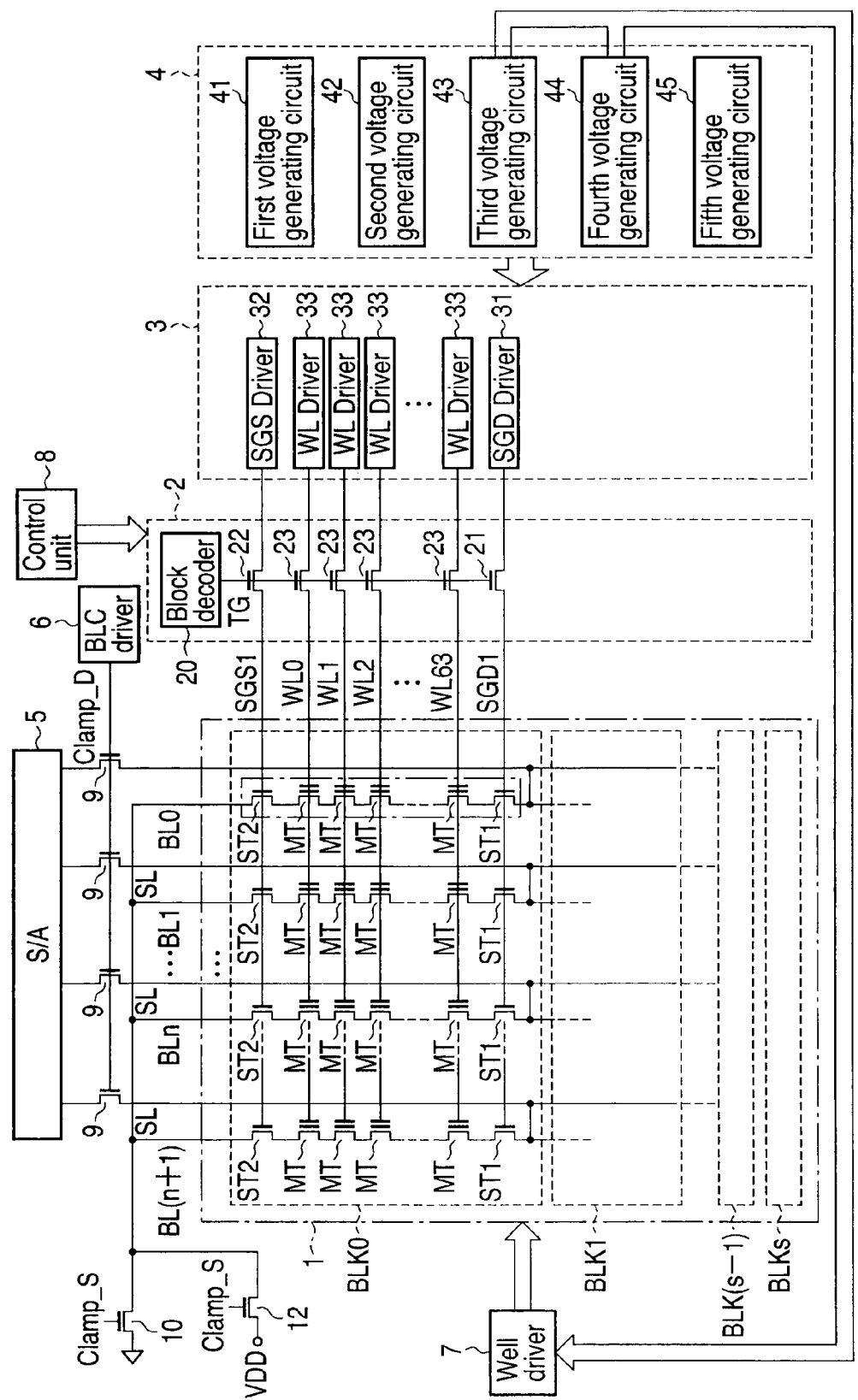
F I G. 1

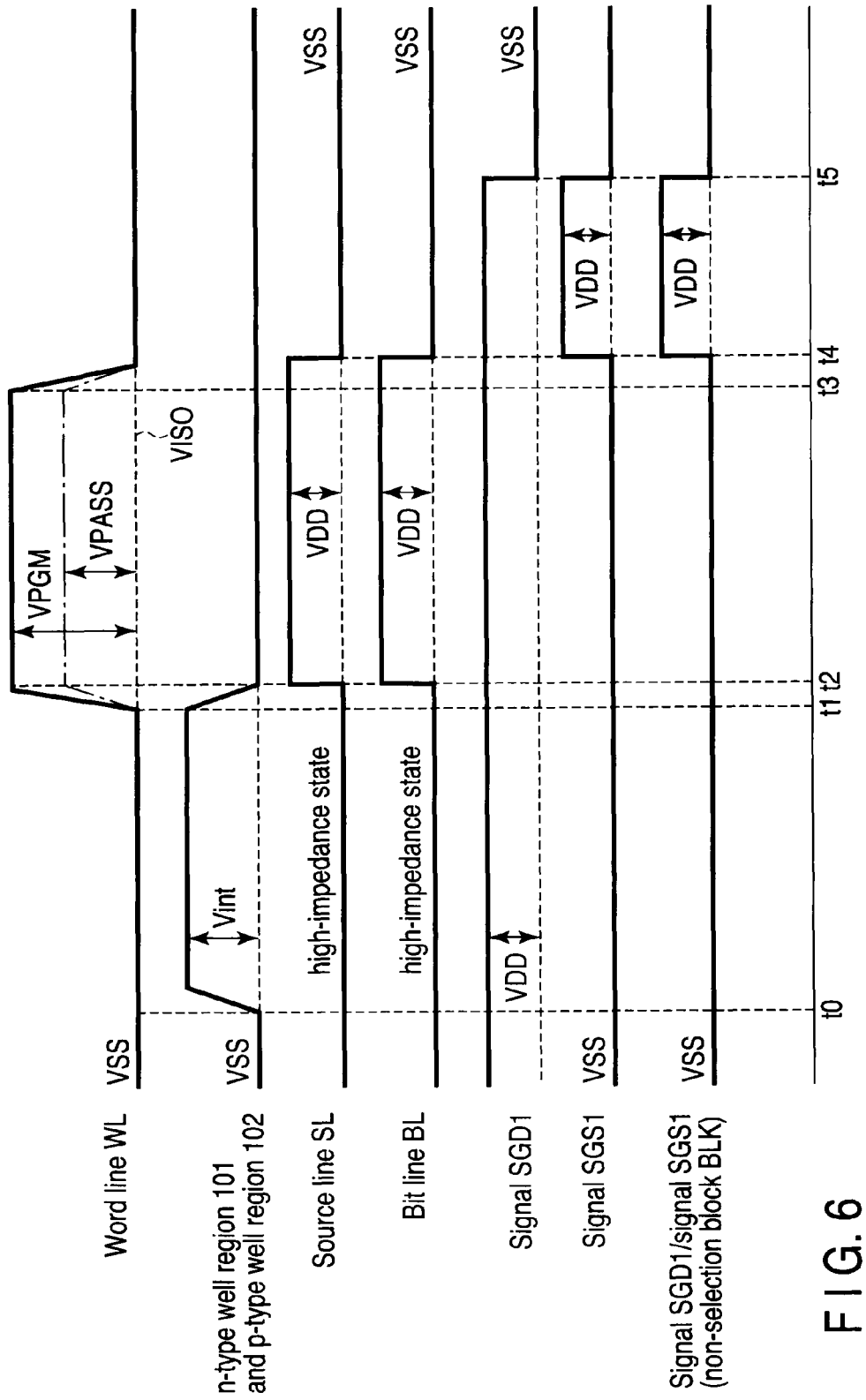
F I G. 6

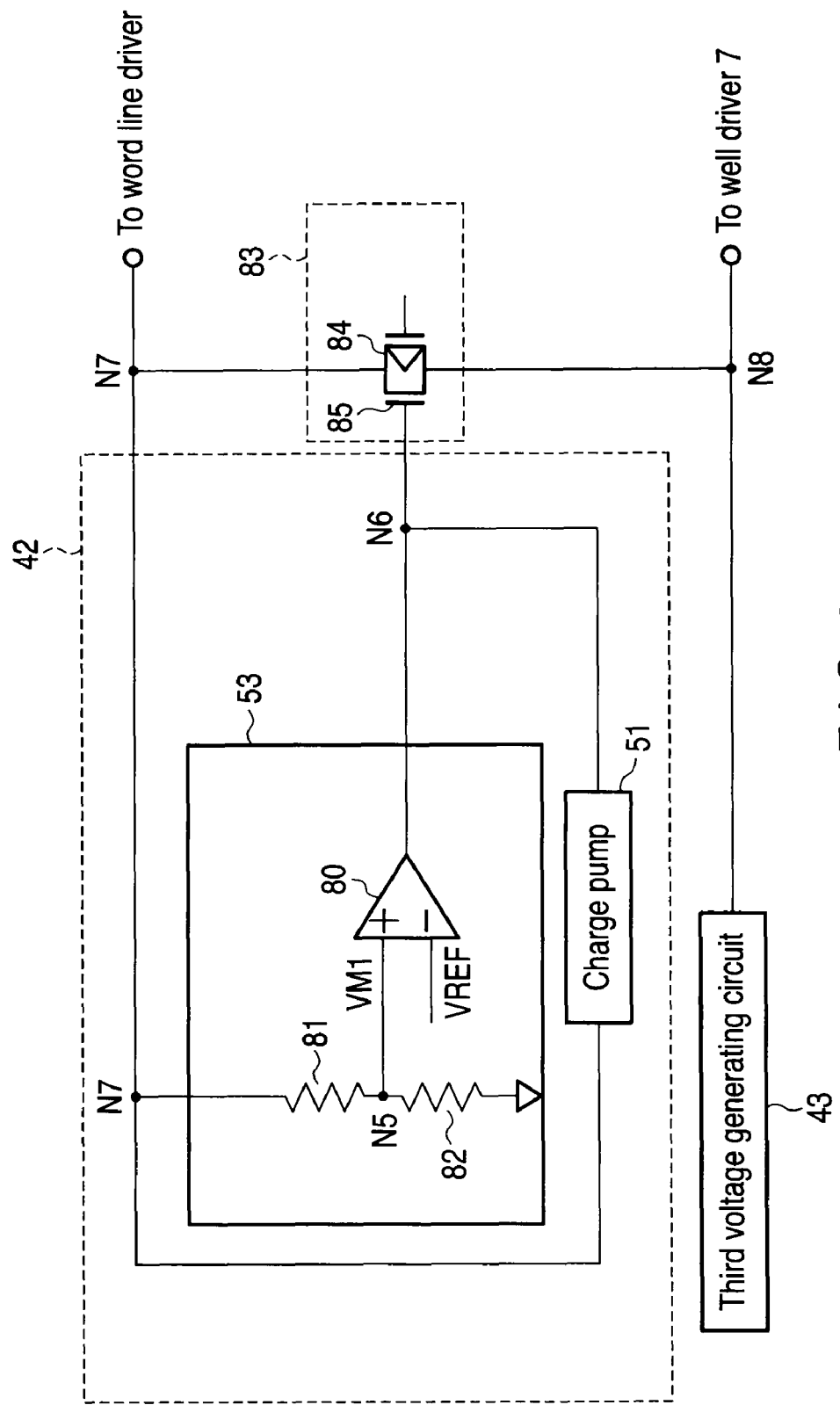
F I G. 9

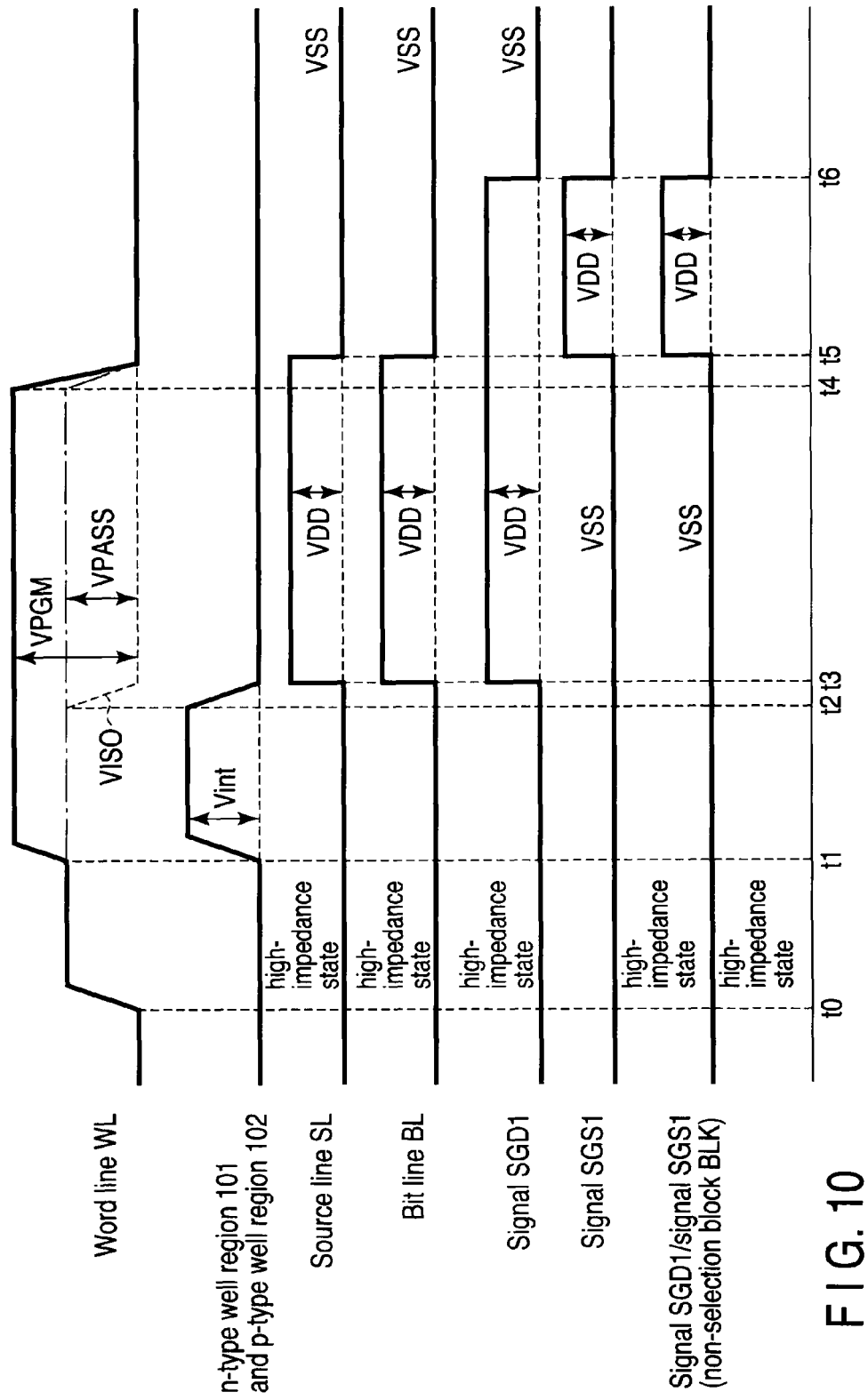
F I G. 10

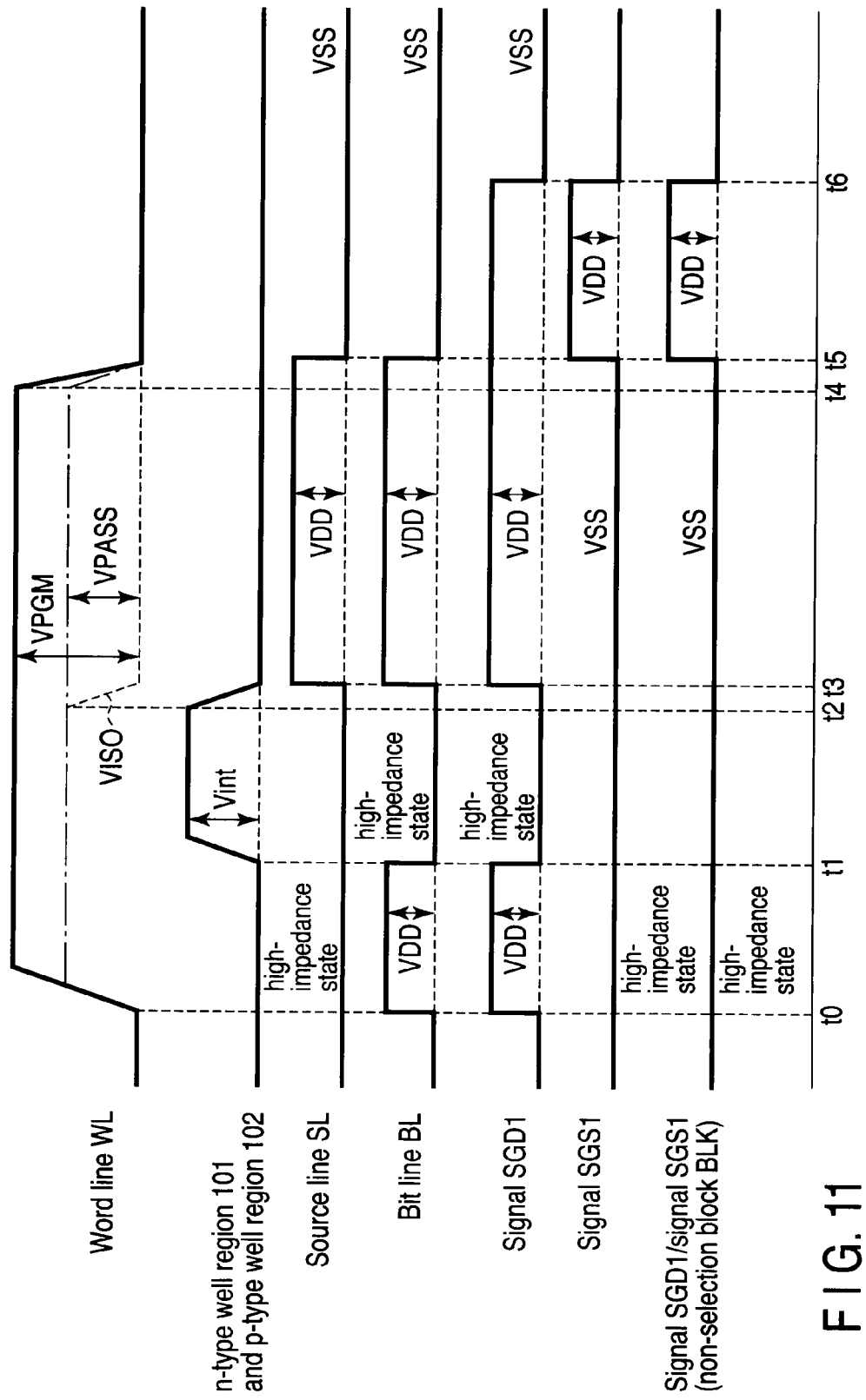
F I G. 11

US 7,924,620 B2

NONVOLATILE SEMICONDUCTOR MEMORY INCLUDING CHARGE ACCUMULATION LAYER AND CONTROL GATE

CROSS-REFERENCE TO RELATED APPLICATIONS

This application is based upon and claims the benefit of priority from prior Japanese Patent Application No. 2009-042701, filed Feb. 25, 2009, the entire contents of which are incorporated herein by reference.

BACKGROUND OF THE INVENTION

1. Field of the Invention

The present invention relates to a nonvolatile semiconductor memory.

2. Description of the Related Art

In order to write "0" data of a NAND-type flash memory, it is necessary that charges be injected in a charge accumulation layer by generating a sufficient potential difference between a control gate and a channel formed between a source and a drain.

On the other hand, in writing "1" data, a predetermined potential transferred from a sense amplifier is previously imparted to the channel such that the potential difference is not generated between the control gate and the channel, thereby preventing the charges from being injected in the charge accumulation layer (for example, see Jpn. Pat. Appln. KOKAI Publication No. 2007-226897).

However, with the advance of low-voltage operation of the NAND-type flash memory, actually the potential difference is generated between the control gate and the channel in a memory cell in which the "1" data should be written, which results in a phenomenon in which the charges are slightly injected (hereinafter the phenomenon is referred to as program disturb). That is, unfortunately, operation reliability of the NAND-type flash memory is deteriorated.

BRIEF SUMMARY OF THE INVENTION

A nonvolatile semiconductor memory according to an aspect of the invention include, a memory cell transistor which includes a charge accumulation layer, a control gate, and a first impurity diffused layer, the charge accumulation layer being formed on an active region, the first impurity diffused layer acting as a source and a drain;

a first MOS transistor which is formed on the active region, the first MOS transistor including a first gate electrode and a second impurity diffused layer, the second impurity diffused layer acting as a drain and a source, the source being commonly connected to the drain of the memory cell transistor;

a second MOS transistor which is formed on the active region, the second MOS transistor including a second gate electrode and a third impurity diffused layer, the third impurity diffused layer acting as a drain and a source, the drain being commonly connected to the source of the memory cell transistor, after the channels being formed, the first MOS transistor and the second MOS transistor are cut off to set the formed channels to a floating state;

a first voltage generating circuit which applies a first voltage to the active region to generate a forward bias between the active region and the first to third impurity diffused layers; and a second voltage generating circuit which applies a second voltage to the control gate of the memory cell transistor which is not a write target, the second voltage generating circuit applying a third voltage to the control gate of the memory cell transistor which is the write target, the third voltage being higher than the second voltage, after the first voltage generating circuit charges the first to third impurity diffused layer to the first voltage, the second voltage generating circuit applying the second voltage and the third voltage to the control gate of the memory cell transistor while the active region is grounded, thereby forming channels in the memory cell transistor and the first and second MOS transistors.

BRIEF DESCRIPTION OF THE SEVERAL VIEWS OF THE DRAWING

FIG. 1 is a block diagram illustrating a NAND-type flash memory according to a first embodiment of the invention;

FIG. 6 is a timing chart illustrating a potential at a word line WL, a potential at a well region, and a potential at a signal line in a write operation of the NAND-type flash memory of the first embodiment;

FIG. 9 is a block diagram illustrating a second voltage generating circuit, a third voltage generating circuit, and a short circuit of the second embodiment;

FIG. 10 is a timing chart illustrating a potential at a word line WL, a potential at a well region, and a potential at a signal line in a write operation of a NAND-type flash memory according to a third embodiment of the invention;

FIG. 11 is a timing chart illustrating a potential at a word line WL, a potential at a well region, and a potential at a signal line in a write operation of a NAND-type flash memory according to a modification of the third embodiment.

DETAILED DESCRIPTION OF THE INVENTION

Figure 2:
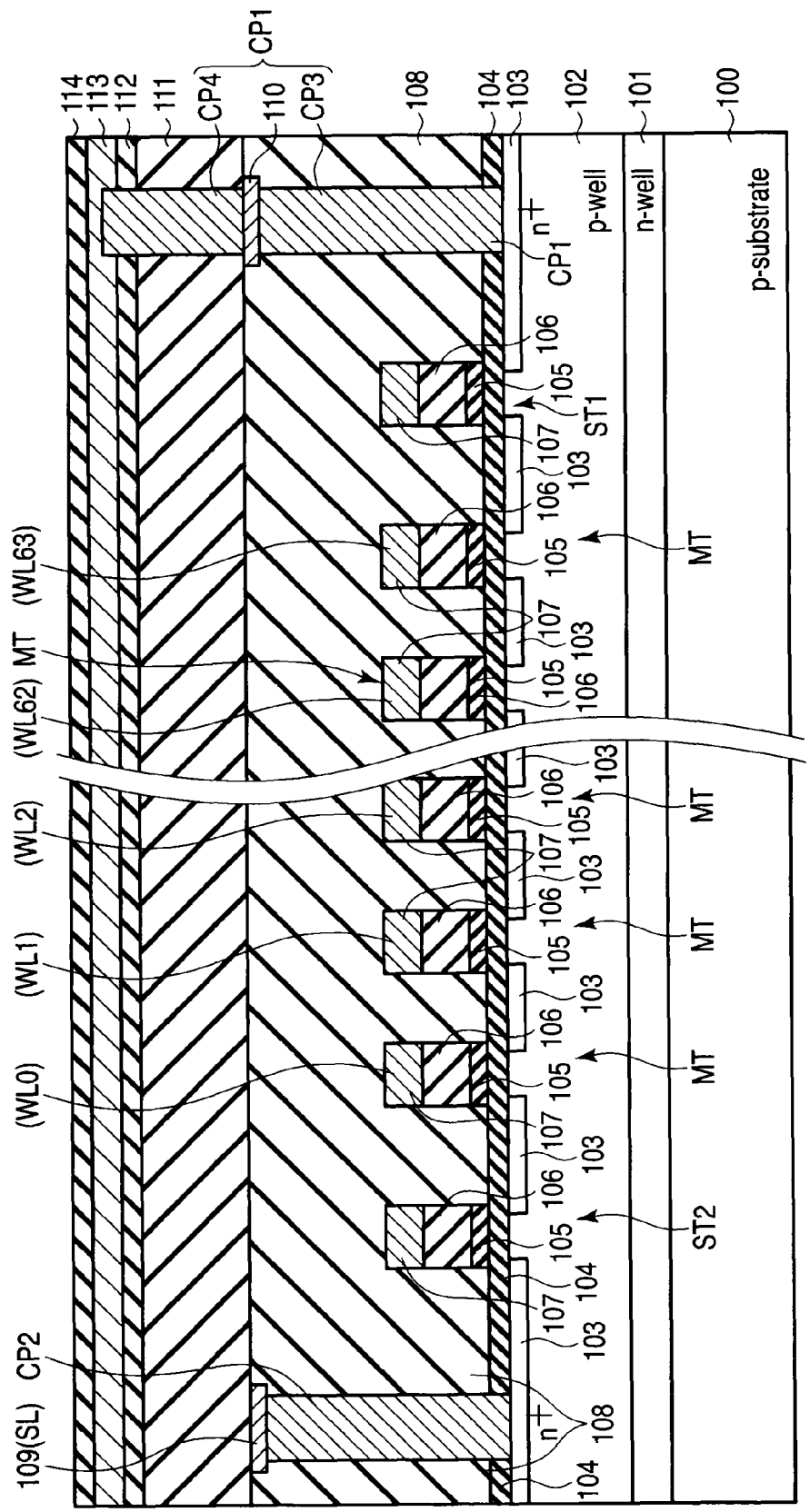
FIG. 2 is a sectional view of the NAND-type flash memory of the first embodiment.

Embodiments of the invention will be described below with reference to the drawings. In the following description, a common component is designated by the same numeral.

First Embodiment

A nonvolatile semiconductor memory according to a first embodiment of the invention will be described with reference to FIG. 1. FIG. 1 is a block diagram illustrating a NAND-type flash memory of the first embodiment. In the NAND-type flash memory of the first embodiment, during the data write, an erasing driver applies a voltage (for example, 3 V or 13 V)

to an active region to generate a data erasing high voltage. Therefore, an impurity diffused layer of a memory cell transistor MT is set to a high initial potential.

Referring to FIG. 1, the NAND-type flash memory includes a memory cell array 1, a row decoder 2, a driver circuit 3, a voltage generating circuit 4, a sense amplifier 5, a BLC driver 6, an erasing well driver 7, a control unit 8, and n-channel type MOS transistors 9, 10, and 12. First the memory cell array 1 will be described.

(Configuration of Memory Cell Array 1)

The memory cell array 1 includes plural nonvolatile memory cell transistors MT in which the data can be stored. The memory cell transistor MT is an n-channel type MOS transistor, the memory cell transistor MT includes a charge accumulation layer and a laminated gate including the control gate. The control gate of the memory cell transistor MT acts as a word line, a drain is electrically connected to a bit line, and a source is electrically connected to a source line. The memory cell array 1 includes blocks BLK0 to BLKs (s is a natural number), and each of the blocks BLK0 to BLKs includes plural nonvolatile memory cell transistors MT.

As illustrated in FIG. 1, each of the blocks BLK0 to BLKs plural NAND strings 11, and the memory cell transistors MT are connected in series in each of the NAND strings 11. For example, each of the NAND strings 11 includes 64 memory cell transistors MT and selection transistors ST1 and ST2. The memory cell transistor MT has a MONOS structure, and the memory cell transistor MT includes a charge accumulation layer (for example, insulator film), an insulator film (hereinafter referred to as block layer), and a control gate electrode. The charge accumulation layer is formed on a semiconductor substrate with a gate insulator film interposed therebetween. The block layer is formed on the charge accumulation layer, and the block layer has a dielectric constant higher than that of the charge accumulation layer. The control gate electrode is formed on the block layer. The number of memory cell transistors MT is not limited to 64, and 128, 256, or 512 memory cell transistors MT may be formed in the NAND string 11. The source and the drain are shared by the memory cell transistors MT adjacent to each other. A current pathway of the memory cell transistors MT is disposed between the selection transistors ST1 and ST2 so as to be connected in series. A drain region on one end of the series-connected memory cell transistors MT is connected to a source region of the selection transistor ST1, and a source region on the other end side is connected to a drain region of the selection transistor ST2.

Control gate electrodes of the memory cell transistors MT located in the same row are commonly connected to one of word lines WL0 to WL63, and gate electrodes of the selection transistors ST1 and ST2 located in the same row are respectively connected to select gate lines SGD1 and SGS1. For the sake of convenience, sometimes the word lines WL0 to WL63 are simply referred to as word line WL unless the word lines WL0 to WL63 are distinguished from one another. The drains of the selection transistors ST1 located in the same column of the memory cell array 1 are commonly connected to one of bit lines BL0 to BLn (n is a natural number). Similarly the bit lines BL0 to BLn are collectively referred to as bit line BL unless the bit lines BL0 to BLn are distinguished from one another. The sources of the selection transistors ST2 are commonly connected to the source line SL. It is not always necessary to provide the selection transistors ST1 and ST2, and only one of the selection transistors ST1 and ST2 may be provided as long as the NAND string 11 can be selected.

The pieces of data are collectively written in the plural memory cell transistors MT connected to the same word line WL, and the unit in which the pieces of data are collectively written in the memory cell transistors MT is referred to as a page. In the plural NAND strings 11, the pieces of data are collectively erased in units of blocks BLK.

(Section of Memory Cell Array 1)

A sectional configuration of the NAND string 11 in the blocks BLK0 to BLKs will be described with reference to FIG. 2. FIG. 2 is a sectional view illustrating the NAND string 11 along a direction of the bit line BL of FIG. 1.

As illustrated in FIG. 2, an n-type well region 101 is formed in a surface region of a p-type semiconductor substrate 100. A p-type well region 102 is formed in a surface region of an n-type well region 101. A gate insulator film 104 is formed on the p-type well region 102, and the gate electrode of the memory cell transistor MT and the selection transistors ST1 and ST2 are formed on the gate insulator film 104. The gate electrode of the memory cell transistor MT and the selection transistors ST1 and ST2 have the laminated structure of the MONOS structure. In the laminated structure, an insulator film 105, an insulator film 106, and a polycrystalline silicon layer 107 are sequentially formed on the gate insulator film 104. For example, the insulator film 106 is made of a material having a dielectric constant higher than that of the insulator film 105. Metal silicide is formed in the surface of the polycrystalline silicon layer 107.

In the memory cell transistor MT, the gate insulator film 104 acts as a tunnel insulator film. The insulator film 105 acts as the charge accumulation layer that accumulates the charge therein, the insulator film 106 acts as the block layer that traps the charges in the insulator film 105, and the polycrystalline silicon layer 107 acts as the control gate. The polycrystalline silicon layers 107 that are adjacent to each other in the direction of the word line WL orthogonal to the direction of the bit line BL of FIG. 1 are commonly connected, and the polycrystalline silicon layer 107 acts as the control gate electrode (word line WL). Hereinafter sometimes the insulator films 105 and 106 and the polycrystalline silicon layer 107 are referred to as charge accumulation layer 105, block layer 106, and control gate 107, respectively.

In the selection transistors ST1 and ST2, the insulator films 105 that are adjacent to each other in the direction of the word line WL are commonly connected. The insulator film 105 acts as the select gate lines SGS and SGD. Alternatively, only the polycrystalline silicon layer 107 may act as the select gate line. In such cases, the potential at the polycrystalline silicon layer 107 of the selection transistor ST1 and ST2 is kept constant or set in a floating state.

An $n^+$-type impurity diffused layer 103 is formed in the surface of the p-type well region 102 located between the gate electrodes. The $n^+$-type impurity diffused layer 103 is shared by the transistors adjacent to each other, and the $n^+$-type impurity diffused layer 103 acts as the source (S) or the drain (D). A region located between the source and drain adjacent to each other acts as a channel region constituting an electron moving region. The transistor constituting the memory cell transistor MT and selection transistors ST1 and ST2 includes the gate electrode, the $n^+$-type impurity diffused layer 103, and the channel region.

An interlayer insulator film 108 is formed on the p-type semiconductor substrate 100 such that the memory cell transistor MT and selection transistors ST1 and ST2 are covered with the interlayer insulator film 108. A contact plug CP2 is formed in the interlayer insulator film 108 so as to reach the $n^+$-type impurity diffused layer (source) 103 of the source-side selection transistor ST2. A metal interconnection layer 109 connected to the contact plug CP2 is formed on the top of the interlayer insulator film 108. The metal interconnection layer 109 acts as part of the source line SL. A metal interconnection layer 110 connected to a contact plug CP3 is formed in the interlayer insulator film 108, and the contact plug CP3 reaches the n$^+$-type impurity diffused layer (drain) 103 of the drain-side selection transistor ST1. An interlayer insulator film 111 is formed on the interlayer insulator film 108. An interlayer insulator film 112 is formed on the interlayer insulator film 111. A metal interconnection layer 113 is formed on the interlayer insulator film 112. The metal interconnection layer 113 acts as the bit line BL. A contact plug CP4 is formed in the interlayer insulator films 111 and 112. A top surface of the contact plug CP4 is connected to the metal interconnection layer 113, and a bottom surface of the contact plug CP4 is connected to the metal interconnection layer 110. In FIG. 2, the contact plug CP3, the metal interconnection layer 110, and the contact plug CP4 act as a contact plug CP1. An insulator film 114 is formed on the metal interconnection layer 113.

(Threshold Distribution of Memory Cell Transistor MT)

Figure 3:
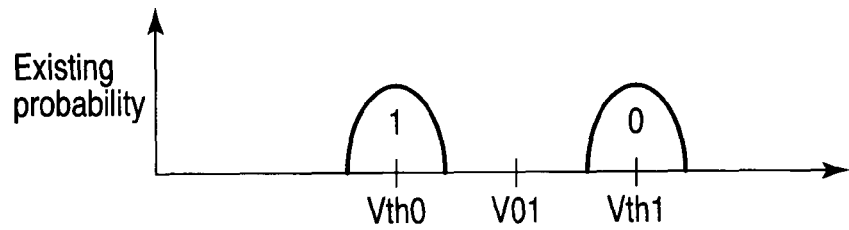
FIG. 3 illustrates a threshold distribution of a memory cell transistor of the first embodiment.

A threshold distribution of the memory cell transistor MT will be described with reference to FIG. 3. In FIG. 3, a horizontal axis indicates the threshold distribution, and a vertical axis indicates an existing probability of the memory cell transistor MT.

As illustrated in FIG. 3, each memory cell transistor MT can retain binary (two-level) data (one-bit data). That is, the memory cell transistor MT can retain two kinds of data, "1" and "0" in the ascending threshold voltage Vth.

In the memory cell transistor MT, a "1"-data threshold voltage Vth0 is lower than V01, and a "0"-data threshold voltage Vth1 is higher than V01. Thus, the memory cell transistor MT can retain the one-bit data of the "0" data and "1" data according to the threshold. The threshold voltage varies by the injection of the charges into the charge accumulation layer. Alternatively, the memory cell transistor MT may retain the data having at least four values.

(Row Decoder 2)

Referring back to FIG. 1, the row decoder 2 will be described. The row decoder 2 includes a block decoder 20 and n-channel type MOS transistors 21 to 23. During the data write operation, the data read operation, and the data erase operation, the block decoder 20 decodes a block address supplied from the control unit 8, and the block decoder 20 selects the block BLK based on the decode result. That is, the block decoder 20 selects a control line TG connected to MOS transistors 21 to 23 corresponding to the block BLK including the selected memory cell transistor MT, and the block decoder 20 turns on the MOS transistors 21 to 23. At this point, the block decoder 20 supplies a block selection signal. As used herein, the block selection signal shall mean a signal for selecting one of the plural memory blocks BLK0 to BLKs during the data read operation, the data write operation, and the data erase operation. Therefore, the row decoder 2 selects the row direction of the memory cell array 1 corresponding to the selected block BLK. That is, the row decoder 2 applies a voltage, supplied from the driver circuit 3, to the select gate lines SGD1 and SGS1 and word lines WL0 to WL63 based on the block selection signal supplied from the block decoder 20.

(Driver Circuit 3)

The driver circuit 3 will be described. The driver circuit 3 includes select gate line drivers 31 and 32 and word line drivers 33. The select gate line drivers 31 and 32 are provided in the select gate lines SGD1 and SGS1, respectively. Each of the word line drivers 33 is provided in each of the word lines WL. In the first embodiment, only the word line drivers 33 and select gate line drivers 31 and 32 corresponding to the block BLK0 are illustrated in FIG. 1. However, actually the word line drivers 33 and the select gate line drivers 31 and 32 are commonly connected to the 64 word lines WL and the select gate lines SGD1 and SGS1, and the 64 word lines WL and the select gate lines SGD1 and SGS1 are provided in each of the blocks BLK0 to BLKs.

When the block BLK is selected according to the decode result of a page address supplied from the control unit 8, the word line driver 33 transfers the necessary voltage supplied from the driver circuit 3 to the control gate of the memory cell transistor MT through the selected word line WL.

When the block BLK is selected according to the decode result of a row address (page address) supplied from the control unit 8, the select gate line driver 31 transfers the necessary voltage to the gate of the selection transistor ST1 through the select gate line SGD1 corresponding to the block BLK. At this point, a signal sgd is transferred to the gate. That is, in writing, reading, erasing, and verifying the data in the memory cell transistor MT, the select gate line driver 31 transfers, for example, the signal sgd to the gate of the selection transistor ST1 through the select gate line SGD1. As the signal sgd, an "L" level is set to 0 V and an "H" level is set to a voltage VDD (for example, 1.8 V).

As with the select gate line driver 31, when the block BLK is selected, the select gate line driver 32 transfers the necessary voltage to the gate of the selection transistor ST2 through the select gate line SGS1 in writing, reading, erasing, and verifying the data in the memory cell transistor MT. As a signal sgs, the "L" level is set to 0 V, and the "H" level is set to the voltage VDD.

(Voltage Generating Circuit 4)

The voltage generating circuit 4 will be described. As illustrated in FIG. 1, the voltage generating circuit 4 includes a first voltage generating circuit 41, a second voltage generating circuit 42, a third voltage generating circuit 43, a fourth voltage generating circuit 44, and a fifth voltage generating circuit 45. The first to fifth voltage generating circuit 41 to 45 will be described with reference to FIG. 4.

Figure 4:
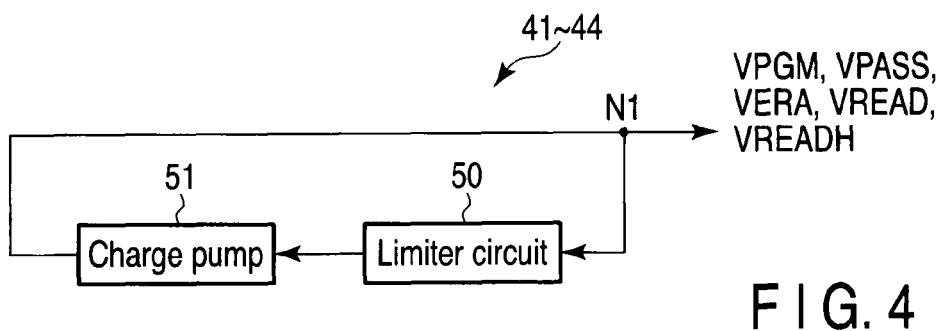
FIG. 4 is a block diagram illustrating first to fifth voltage generating circuits of the first embodiment.

Referring to FIG. 4, each of the first voltage generating circuit 41 to fifth voltage generating circuit 45 includes a limiter circuit 50 and a charge pump circuit 51. The charge pump 51 generates the voltages necessary for the control unit 8 to perform the data write operation, the erase operation, and the read operation. Each of the generated voltages is supplied from a node N1 to the row decoder 2 in the NAND-type flash memory through the driver circuit 3. The limiter circuit 50 controls the charge pump circuit 51 according to a potential at the node N1 while monitoring the potential at the node N1. The limiter circuit 50 stops the pumping of the charge pump circuit 51 to step down the potential at the node N1 when the potential at the node N1 is higher than a predetermined value. The limiter circuit 50 directs the charge pump circuit 51 to perform the pumping to boost the potential at the node N1 when the potential at the node N1 is lower than the predetermined value.

Then voltages generated by the first to fifth voltage generating circuits 41 to 45 will be described. In writing the data, the first voltage generating circuit 41 generates a voltage VPGM and transfers the voltage VPGM to the selection word line WL. The voltage VPGM is a voltage having magnitude of a degree in which the charges in the channel of the memory cell transistor MT are injected in the charge accumulation layer to cause the threshold of the memory cell transistor MT to make a transition to another level.

The second voltage generating circuit 42 generates a voltage VPASS to transfer the voltage VPASS to the non-selection word line WL. The voltage VPASS is a voltage at which the memory cell transistor MT is turned on.

The third voltage generating circuit 43 generates a voltage VERA to transfer the voltage VERA to the well driver 7. At this point, the third voltage generating circuit 43 controls the limiter circuit 50 to generate a voltage of 20 V, 13 V, or 3 V. In erasing the data, the voltage of 20 V is generated as the voltage VERA and applied to the well region where the memory cell transistors MT are formed. In writing the data, the voltage VERA is set to the voltage of 3 V or 13 V and applied to the well region.

The fourth voltage generating circuit 44 generates a voltage VISO to transfer the voltage VISO to the non-selection word line WL that is adjacent to the source side of the selection word line WL. The voltage VISO is a voltage at which the selection word line WL and the non-selection word line WL are electrically separated from each other. That is, the voltage VISO is a voltage at which the channel is not formed in the memory cell transistor MT, that is, 0 V. For example, when the third voltage generating circuit 43 generates the voltage VERA of 13 V, the voltage VISO has the same value as the voltage VPASS.

The fifth voltage generating circuit 45 generates a voltage VREADH to transfer the voltage VREADH to the well driver 7. The voltage VREADH is a voltage necessary to drive a level shifter L/S of the well driver 7.

(Sense Amplifier 5)

In reading the data, the sense amplifier 5 senses and amplifies the data read from the memory cell transistor MT to the bit line BL. More specifically the sense amplifier 5 precharges the voltage VDD to the bit line BL. The sense amplifier 5 senses the voltage (or current) at the bit line BL.

The sense amplifier 5 transfers the voltage VDD, transferred from the voltage generating circuit 4, to the bit line BL in writing the data.

The data read and the data write are performed one by one in the two adjacent bit lines BL. Examples of the set of two adjacent bit lines BL include a set of bit lines BL0 and BL1, a set of bit line BL2 and BL3, and a set of bit lines BL4 and BL5. The same holds true in the following. That is, the pieces of data are collectively read from or written in n/2 bit lines BL in n bit lines BL. Hereinafter the bit line BL that becomes a read or write target in the set of bit lines BL is referred to as selection bit line BL, and the bit line BL that does not become the read or write target is referred to as non-selection bit line BL.

(BLC Driver 6)

The BLC driver 6 will be described. The BLC driver 6 applies the necessary voltages to the gate of the MOS transistor 9 to turn on or turn off the MOS transistor 9. When the MOS transistor 9 is turned off, the bit line BL is in an opened state.

(Well Driver 7)

Figure 5:
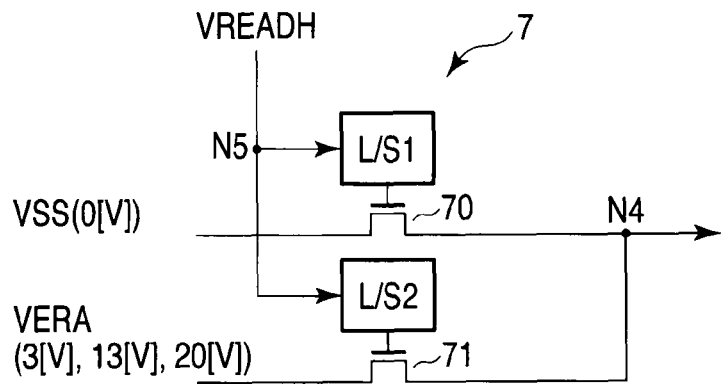
FIG. 5 is a block diagram illustrating a well driver of the first embodiment.

A configuration of the well driver 7 will be described with reference to FIG. 5. FIG. 5 illustrates a circuit diagram of the well driver 7. Referring to FIG. 5, the well driver 7 includes n-channel type MOS transistors 70 and 71 and level shifters L/S1 and L/S2.

The level shifter L/S1 supplies a signal to a gate of a MOS transistor 70, a voltage VSS (for example, 0 V) is applied to one end of the current pathway, and the other end of the current pathway is electrically connected to the n-type well region 101 and the p-type well region 102.

The level shifter L/S2 supplies a signal to a gate of a MOS transistor 71, the voltage VERA (for example, 20 V, 3 V, or 13 V) is applied to one end of the current pathway, and the other end of the current pathway is electrically connected to the n-type well region 101 and the p-type well region 102.

The level shifters L/S1 and L/S2 supply the signals that are converted into a level of the voltage VREADH. During the program, the level shifters L/S1 and L/S2 supply "H"-level signals having the level of the voltage VREADH. In erasing the data, the level shifter L/S2 supplies the "H"-level signals having the level of the voltage VREADH.

That is, during the program, the MOS transistors 70 and 71 are turned on to impart either the voltage VERA or the voltage VSS set to, for example, or 3 V or 13 V to the n-type well region 101 and the p-type well region 102. When the voltage VERA set to 3 V or 13 V is imparted to the n-type well region 101 and the p-type well region 102, the voltage charged in the $n^+$-type impurity diffused layer 103 is referred to as voltage Vint. In erasing the data, only the MOS transistor 71 is turned on, and the voltage VERA of, for example, 20 V is imparted to the n-type well region 101 and the p-type well region 102.

(Control Unit 8)

The control unit 8 will be described. The control unit 8 controls the whole operation of the NAND-type flash memory. The control unit 8 performs operation sequences in the data write operation, read operation, and erase operation based on the address and command, which are supplied from a host (not illustrated). Specifically, the control unit 8 controls the voltage output timing of each of the first to fourth voltage generating circuits 41 to 44. The control unit 8 generates a block selection signal and a column selection signal based on the address and the operation sequence. The control unit 8 supplies the block selection signal to the row decoder 2.

(MOS Transistor 9)

Referring back to FIG. 1, the MOS transistor 9 will be described. Each of the MOS transistors 9 is connected to the bit line BL and the sense amplifier 4. That is, in each of the MOS transistors 9, one end of the current pathway is connected to the corresponding bit line BL, and the other end of the current pathway is connected to the corresponding sense amplifier 4. A signal Clamp_D generated by the BLC driver 6 is imparted to the gate of the MOS transistor 9. For example, the signal Clamp_D is set to the voltage VDD.

(MOS Transistors 10 and 12)

Next, the MOS transistors 10 and 12 will be described. One end of the current pathway of the MOS transistor 10 is connected to the source line SL, and the other end of the current pathway is grounded. A signal Clamp_S is imparted to the gate of the MOS transistor 10. One end of the current pathway of the MOS transistor 12 is commonly connected to one end of the current pathway of the MOS transistor 10, and the voltage VDD is supplied to the other end of the current pathway. The signal Clamp_S is imparted to the gate of the MOS transistor 12. The MOS transistors 10 and 12 act as the driver of the source line SL, respectively. The potential at the source line SL is set to 0 V when the MOS transistor 10 is turned on, and the potential at the source line SL is set to the voltage VDD when the MOS transistor 12 is turned on. The control unit 8 controls the signal Clamp_S imparted to the gates of the MOS transistors 10 and 12.

(Write Operation of NAND-Type Flash Memory)

The "1"-data and "0"-data write operation in the selection bit line BL of the NAND-type flash memory will be described with reference to FIG. 6. FIG. 6 is a timing chart of the potentials at the selection and non-selection word lines WL, the potentials at the n-type well region 101 and p-type well region 102, the potential at the source line SL, the potential at the bit line BL, the signal SGD1 and signal SGS1, and the signal SGD1 and signal SGS1 of the non-selection block BLK. The control unit 8 controls the timing of the voltage transfer operation of each unit. The same holds true for all the following embodiments. Because the operation of the non-selection bit line BL is identical to the "1"-data write in the selection bit line BL, the description is omitted. It is assumed that the word line WL32 is the selection word line WL of the memory cell transistor MT, which is of the write target. Therefore, the word line WL31 is the non-selection word line WL to which the voltage VISO is transferred.

("1"-Data Write)

As illustrated in FIG. 6, because the write operation is not started before a time t0, the potentials at the word line WL, n-type well region 101, and p-type well region 102 are set to the voltage VSS (for example, 0 V). The source line SL and the bit line BL are set to a high-impedance state. That is, the MOS transistors 9 and 10 are tuned off. Because the signal SGD1 is set to the "H" level, the selection transistor ST1 is turned on.

The well driver 7 applies the voltage VERA of, for example, 3 V at the time t0 to the n-type well region 101 and the p-type well region 102 in order to start the data write, thereby applying a forward bias to the p-type well region 102 and the $n^+$-type impurity diffused layer 103. Therefore, the $n^+$-type impurity diffused layer 103 is set to the potential Vint. At this point, because the source line SL and the bit line BL are opened and in the high-impedance state, the potential at the $n^+$-type impurity diffused layer 103 is not transferred to the source line SL and sense amplifier 4 through the contact plug CP2, contact plug CP1, and bit line BL.

At a time t1, the potentials at the n-type well region 101 and p-type well region 102 are set to the voltage VSS. That is, the MOS transistor 70 of the well driver 7 is in a turned on state to transfer the voltage VSS to the n-type well region 101 and p-type well region 102. At this point, because a reverse bias is applied to the $n^+$-type impurity diffused layer 103 and the p-type well region 102, the $n^+$-type impurity diffused layer 103 is maintained at the potential Vint.

At the time t1, the potential at the selection word line WL32 is set to the voltage VPGM. The potential at the non-selection word line WL31 that is adjacent to the source side of the selection word line WL is set to the voltage VISO. Because the potentials at the non-selection word lines WL0 to WL30 and non-selection word lines WL33 to WL63 are set to the voltage VPASS, the channels are formed in the memory cell transistors MT of the non-selection word lines WL0 to WL30, non-selection word lines WL33 to 63, and selection word line WL32. The potentials at the formed channels become substantially equal to the voltage Vint in the $n^+$-type impurity diffused layer 103. Therefore, because the potential at the source of the selection transistor ST1 is set to the voltage Vint, the selection transistor ST1 is cut off. At the time t1, the potentials at the source line SL and bit line BL are set to the voltage VDD. The MOS transistors 9 and 10 are turned on, the voltage VDD is transferred from the sense amplifier 4, and the voltage VDD is transferred from the MOS transistor 12 acting as the source line driver. Because the potential at the drain of the selection transistor ST2 is set to the voltage VDD, the selection transistor ST2 is cut off. That is, the NAND string 11 attains the floating state, and the potentials at the channels are boosted by the coupling to the word line WL (hereinafter the phenomenon is referred to as self boost) and set to (voltage Vint+self boost potential), so that the charge injection is suppressed to a degree in which the data retained in the memory cell transistor MT does not make the transition to another level. Accordingly, the "1" data is written in the memory cell transistor MT.

Then, at a time t3, the potential at the word line WL is set to 0 V, and the potentials at the source line SL and bit line BL are also set to 0 V. At a time t4, the signal SGS1 is set to the "H" level, that is, the voltage VDD. Therefore, the selection transistor ST2 is turned on, and the potentials at the channels formed in the memory cell transistors MT corresponding to the non-selection word lines WL0 to WL30 in the selection block BLK are discharged toward the source line SL. At a time t4, the selection transistor ST1 is in a turned on state because the signal SGD1 is set to the "H" level, that is, the voltage VDD. Therefore, the potentials at the channels formed in the memory cell transistors MT corresponding to the selection word line WL32 and non-selection word lines WL33 to WL63 are discharged toward the sense amplifier 4, that is, the potentials at the channels are set to 0 V.

Because the NAND string 11 in the non-selection block BLK is formed on the same well as the selection block BLK, the channels formed in the NAND string 11 are maintained at a predetermined potential. Therefore, at the time t4, the signals SGD1 and SGS1 corresponding to the selection transistors ST1 and ST2 in the non-selection block BLK are set to the "H" level, that is, the voltage VDD, and the selection transistors ST1 and ST2 of the non-selection block BLK are turned on. Because the bit line BL is set to 0 V, the potential at the NAND string 11 in the non-selection block BLK is discharged to 0 V. Then, at a time t5, the signals SGD1 and SGS1 are set to the "L" level, that is, 0 V to turn off the selection transistors ST1 and ST2.

The "0"-data write in the memory cell transistor MT corresponding to the selection bit line BL will be described. Description of the same operation as the "1"-data write will not be repeated here.

("0"-Data Wire)

In the "0" data write, it is necessary that the potential at the channel of the target NAND string 11 be set to 0 V, that is, it is necessary that the potential at the channel formed at the time t1 when the voltage VPGM is transferred to the selection word line WL be set to 0 V. Therefore, the selection transistor ST1 is turned on because the sense amplifier 4 sets the potential at the bit line BL to the voltage VSS (for example, 0 V) at the time t2. The potential at the channel formed in the NAND string 11 is stepped down from the voltage Vint to 0 V, thereby generating a potential difference VPGM between the channel and the selection word line WL. Therefore, the charges are injected in the charge accumulation layer to a degree in which the data retained in the memory cell transistor MT makes the transition to another level. Accordingly, the "0" data is written in the memory cell transistor MT through the bit line BL. The voltage transfer operation performed by the well driver 7 that applies the voltage to the n-type well region 101 and p-type well region 102 will be described with reference to FIG. 7.

(Voltage Transfer Operation of Well Driver 7)

Figure 7:
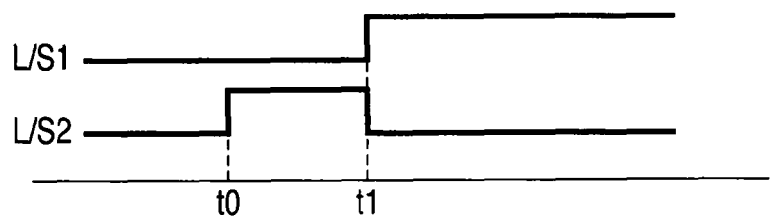
FIG. 7 is a timing chart illustrating shift registers L/S1 and L/S2 in a voltage transfer operation of a well driver of the first embodiment.

FIG. 7 illustrates the voltage transfer operation of the well driver 7 during the data write operation in the memory cell transistor MT, and FIG. 7 is a timing chart illustrating output signals of the shift registers L/S1 and L/S2.

As illustrated in FIG. 7, at a time t0 the shift register L/S2 supplies the "H"-level signal in order to start the write operation. Therefore, the MOS transistor 71 is turned on, and the MOS transistor 71 transfers the voltage VERA of, for example, 3 V transferred from the third voltage generating circuit 43 to the n-type well region 101 and p-type well region 102. At a time t1, the shift register L/S2 supplies the "L"-level signal, thereby turning off the MOS transistor 71.

At the time t1, the shift register L/S1 supplies the "H"-level signal. Therefore, the MOS transistor 70 is turned on to transfer the voltage VSS to the n-type well region 101 and p-type well region 102, thereby discharging the n-type well region 101 and p-type well region 102, which are charged to the voltage Vint.

Effect of First Embodiment

According to the nonvolatile semiconductor memory of the first embodiment, advantageously the operation reliability can be improved. That is, the following effect can be obtained:

(1) The false write can be prevented in the data write operation (part 1).

The effect of the first embodiment will be described while referring to the problems in the conventional technique.

(Problem 1)

In the conventional technique, while the selection transistor ST1 is turned on, the sense amplifier 4 supplies the voltage VDD (for example, 1.8 V) to the non-selection bit line BL and the selection bit line BL in which the "1" data is written, thereby charging the channel of the NAND string 11 to the voltage VDD. The potential at the channel in the NAND string 11 is self-boosted by the coupling to the word line WL while the selection transistor ST1 is cut off. Therefore, the false write is prevented. However, the value of the voltage charged in the channel from the sense amplifier 4 is lowered with the advance of low-voltage operation of the NAND-type flash memory, and the potential at the channel is insufficiently boosted even after the self boost, which results in the generation of the false write.

(Problem 2)

Further, when the charges are accumulated in the charge accumulation layer of the memory cell transistor MT corresponding to the non-selection word line WL, an electric flux line generated from the control gate of the memory cell transistor MT is terminated in the charge accumulation layer even if the voltage VPASS is transferred to the non-selection word line WL. Accordingly, the potential at the channel is not boosted by the coupling to the word line WL, and the false write is generated in the memory cell transistor MT corresponding to the selection word line WL to which the voltage VPGM is transferred. Therefore, there is adopted a method in which the memory cell transistor MT, in which the data is already written, corresponding to the non-selection word line WL and the memory cell transistor MT of the write target are electrically separated by applying the voltage VISO of, for example, 0 V to the control gate of the memory cell transistor MT located on the source side of the selection word line WL. However, in the method, the voltage VDD is not charged from the sense amplifier 4 into the channel formed in the memory cell transistor MT corresponding to the non-selection word line WL located on the source side of the selection word line WL, and the voltage VPASS or the voltage VPGM is transferred to the control gate of the memory cell transistor MT depending on the data that is already written and retained in the memory cell transistor MT, which possibly results in a risk of the false write.

(Effect)

On the other hand, the problems 1 and 2 can be solved in the nonvolatile semiconductor memory of the first embodiment. That is, in the nonvolatile semiconductor memory of the first embodiment, even if the low-voltage operation of the NAND-type flash memory advances, the third voltage generating circuit 43 that transfers the voltage VERA of, for example, 3 V is used in the well region, and the voltage VERA is applied to the n-type well region 101 and p-type well region 102 like the data erase. Therefore, because the forward bias is generated between the well region and the $n^+$-type impurity diffused layer 103, the voltage Vint is charged into the $n^+$-type impurity diffused layer 103. Because the voltage Vint is higher than the voltage VDD that is conventionally transferred from the sense amplifier through the bit line BL, the value of the voltage initially charged into the channel is increased. The floating further boosts the potential at the channel by the self boost, so that the false write can be prevented.

The third voltage generating circuit 43 transfers the voltage VERA of, for example 3 V from the well region, thereby charging the voltage Vint in all the $n^+$-type impurity diffused layers 103 in the NAND string 11. That is, even if the voltage VISO is transferred to the non-selection word line WL that is adjacent to the source side of the selection word line WL, all the $n^+$-type impurity diffused layers 103 are charged by the voltage Vint that is higher than the voltage VDD. Therefore, after the channel is formed, the potential at the channel in the memory cell transistor MT in which the data is already written is boosted to a higher value than before by the self boost. Accordingly, the false write can be prevented in the NAND string 11 corresponding to the non-selection bit line BL and the selection bit line WL in which the "1" data is written.

Second Embodiment

A nonvolatile semiconductor memory according to a second embodiment of the invention will be described below. The nonvolatile semiconductor memory of the second embodiment differs from the nonvolatile semiconductor memory of the first embodiment in that the time the well driver 7 applies the voltage VERA to the n-type well region 101 and p-type well region 102 is synchronized with the time the first and second voltage generating circuits 41 and 42 transfer the voltage VPGM and the voltage VPASS to the word line WL. At this point, in order to charge the $n^+$-type impurity diffused layer 103 to at least a positive potential, the voltage VERA applied to the n-type well region 101 and the p-type well region 102 by the well driver 7 is larger than the voltage VPASS transferred to the word line WL. Therefore, as described above, the voltage VERA supplied from the charge pump 51 to the node N1 is changed by controlling the limiter circuit 50 of the third voltage generating circuit 43. At this point, for example, the voltage VERA is set to 13 V. In the second embodiment too, the potential at which the well driver 7 applies the voltage VERA to the n-type well region 101 and the p-type well region 102 to charge the channel is called voltage Vint.

When the voltage VISO is set to 0 V in applying the voltage VERA of 13 V to the n-type well region 101 and the p-type well region 102, because the false erase is possibly generated, the voltage VISO is comparable in value to the voltage VPASS. The description of the same operation as that of FIG. 6 in the first embodiment is omitted.

The operation of the nonvolatile semiconductor memory of the second embodiment will be described below with reference to FIG. 8.

(Operation of Nonvolatile Semiconductor Memory)

The "1"-data write operation in the selection bit line BL of the NAND-type flash memory will be described with reference to FIG. 8. FIG. 8 is a timing chart illustrating the potentials at the selection and non-selection word lines WL, the potentials at the n-type well region 101 and p-type well region 102, the potential at the source line SL, the potential at the bit line BL, the signals SGD1 and SGS1, and the signals SGD1 and SGS1 of the non-selection block BLK. Because the operation of the non-selection bit line BL is identical to the "1"-data write in the selection bit line BL, the description is omitted. Since the "0"-data write operation in the memory cell transistor MT corresponding to the selection bit line BL is identical to that of the first embodiment, the description is omitted.

("1"-Data Write)

Figure 8:
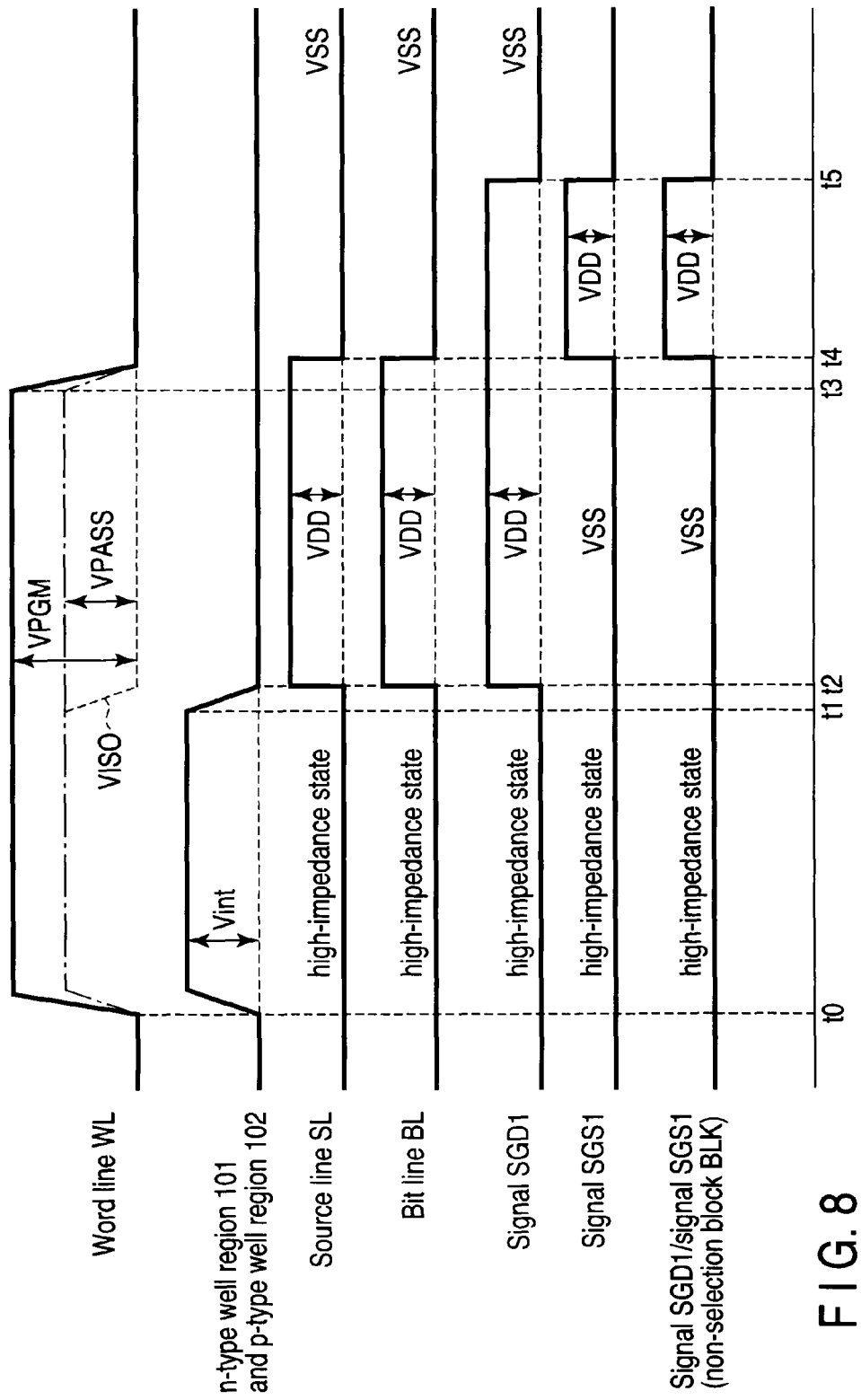
FIG. 8 is a timing chart illustrating a potential at a word line WL, a potential at a well region, and a potential at a signal line in a write operation of a NAND-type flash memory according to a second embodiment of the invention.

As illustrated in FIG. 8, because the write operation is not started before a time t0, the potentials at the word line WL, the n-type well region 101, and the p-type well region 102 are set to the voltage VSS (for example, 0 V). The source line SL and the bit line BL are set to the high-impedance state. That is, the MOS transistors 9 and 10 are turned off to open the source line SL and the bit line BL. All the select gate lines SGD1 and SGS1 in the selection block BLK and the non-selection block BLK are set to the floating state. That is, the selection transistors ST1 and ST2 corresponding to the blocks BLK0 to BLKs are turned off.

The well driver 7 applies the voltage VERA at the time t0 to the n-type well region 101 and the p-type well region 102 in order to start the data write, thereby applying the forward bias to the p-type well region 102 and the $n^+$-type impurity diffused layer 103. At the time t0, the potential at the selection word line WL32 is set to the voltage VPGM. The potential at the non-selection word line WL31 that is adjacent to the source side of the selection word line WL32 is set to the voltage VISO (for example, the same value as the voltage VPASS). The potentials at the non-selection word lines WL0 to WL30 and non-selection word lines WL33 to WL63 are set to the voltage VPASS. Therefore, the channels are formed in the NAND string 11, and the potentials at the channels are substantially equal to the voltage Vint at the $n^+$-type impurity diffused layer 103. Because the potentials at the channel are set to 13 V, the potential at the source of the selection transistor ST1 is set to the voltage Vint to cut off the selection transistor ST1.

At this point, because the source line SL and the bit line BL are opened and in the high-impedance state, the potential at the $n^+$-type impurity diffused layer 103 is not transferred to the sense amplifier 4 and the source line SL through the contact plug CP2, contact plug CP1, and bit line BL. Because the select signal lines SGD1 and SGS1 are set to the floating state after the time t0, dielectric breakdown is not generated in the gate oxide film 105 of the selection transistors ST1 and ST2 even if the voltage Vint is applied to the n-type well region 101 and the p-type well region 102.

At a time t1, the potentials at the n-type well region 101 and p-type well region 102 are set to the voltage VSS. At this point, because the reverse bias is applied to the $n^+$-type impurity diffused layer 103 and the p-type well region 102, the $n^+$-type impurity diffused layer 103 is maintained at the potential Vint. At the time t1, the voltage VISO is set to 0 V. Therefore, the channels of the memory cell transistors MT corresponding to the non-selection word line WL31 are eliminated, and the channels are divided into the channel formed in the memory cell transistors MT corresponding to the non-selection word lines WL0 to 30 and the channels formed in the memory cell transistors MT corresponding to the selection word line WL32 and non-selection word lines WL33 to 63.

At a time t2, the potentials at source line SL and bit line BL are set to the voltage VDD. Therefore, the potential at the drain of the selection transistor ST2 is set to the voltage VDD to cut off the selection transistor ST2. That is, the channels formed in the memory cell transistors MT except for the memory cell transistors MT corresponding to the non-selection word line WL31 are set to the floating state, and the potentials at the channels are boosted by the coupling to the word line WL. The potentials at the channels are set to (voltage Vint+self boost potential), so that the charge injection is suppressed to a degree in which the data retained in the memory cell transistor MT does not make the transition to another level. Accordingly, the "1" data is written in the memory cell transistor MT.

Effect of Second Embodiment

In the nonvolatile semiconductor memory of the second embodiment, the following effect can be obtained in addition to the effect (1) of the first embodiment. The effect of the second embodiment will be described below.

(2) The false write can be prevented in the data write operation (part 2).

In the nonvolatile semiconductor memory of the second embodiment, the time the well driver 7 applies the voltage VERA to the n-type well region 101 and the p-type well region 102 is synchronized with the time the first voltage generating circuit 41, the second voltage generating circuit 42, and the fourth voltage generating circuit 44 transfer the voltage VPASS, the voltage VPGM, and the voltage VISO to the word line WL. The time the $n^+$-type impurity diffused layer 103 is charged to the voltage Vint is synchronized with the time the voltage VPASS, the voltage VPGM, and the voltage VISO are transferred to the word line WL. For this reason, while the channel is formed in memory cell transistor MT, the $n^+$-type impurity diffused layer 103 that acts as the source and drain of the memory cell transistor MT is charged to, for example, 13 V. The channel formed in the memory cell transistor MT is charged to, for example, 13 V. That is, the potential at the channel is made equal to the potential of 13 V at the $n^+$-type impurity diffused layer 103, so that the false write can further be prevented in the NAND string 11 corresponding to the non-selection bit line BL and selection bit line BL in which the "1" data is written compared with the nonvolatile semiconductor memory of the first embodiment.

This is because the rising times of the voltages supplied from the first to fourth voltage generating circuits 41, 42, and 44 are synchronized with one another, whereby the $n^+$-type impurity diffused layer 103 is charged to the voltage Vint of, for example, 13 V while the channel is formed in the memory cell transistor MT. The channel is not formed after the $n^+$-type impurity diffused layer 103 is set to the voltage Vint, but the $n^+$-type impurity diffused layer 103 is charged to the voltage Vint while the channel is formed. By doing this, a combined capacitance of a capacitance between the control gate 107 and the $n^+$-type impurity diffused layer 103 (source), a capacitance between the control gate 107 and the $n^+$-type impurity diffused layer 103 (drain), and a capacitance between the control gate 107 and the channel can be seen from the control gate 107 of the memory cell transistor MT. Accordingly, the phenomenon in which, as described in the first embodiment, after the $n^+$-type impurity diffused layer 103 is charged to the voltage Vint, a parasitic capacitance is generated by the channel to lower the potential at the $n^+$-type impurity diffused layer 103 charged to the voltage Vint is not generated. The phenomenon is expressed as follows:

$$V_1 = \frac{C_1}{C_1 + C_2}(V_g + V_{int}) \qquad (1)$$

where a voltage $V_1$ is the potential at the $n^+$-type impurity diffused layer 103, $C_1$ is a capacitance of the gate electrode of the memory cell transistor MT, $C_2$ is capacitances of the n-type well region 101, p-type well region 102, and channel, and $V_g$ is a voltage transferred to the word line WL. When the channel is formed while the initial charge is not performed to the $n^+$-type impurity diffused layer 103, a voltage $V'_1$ at the $n^+$-type impurity diffused layer 103 is expressed as follows:

$$V'_1 = \frac{C_1}{C_1 + C_2}(V_g) \qquad (2)$$

A differential potential $\Delta V_1$ between the voltage $V_1$ and the voltage $V'_1$ is expressed as follows:

$$\Delta V_1 = \frac{C_1}{C_1 + C_2} V_{int} \qquad (3)$$

where $\Delta V_1$ is the value to which the well driver 7 charges the n+-type impurity diffused layer 103. That is, the initial charge is performed to the n+-type impurity diffused layer 103 with the higher value as the voltage Vint is increased, and the false write can be prevented via the voltage Vint.

First Modification

A nonvolatile semiconductor memory according to a modification of the second embodiment will be described below. The nonvolatile semiconductor memory of the modification differs from the nonvolatile semiconductor memory of the second embodiment in that the second voltage generating circuit 42 and the third voltage generating circuit 43 are shorted by a switch element if needed. That is, a gradient in which the voltage VERA is boosted is equalized with a gradient in which the voltage VPASS is boosted until the voltage VPASS reaches to, for example, 10 V.

FIG. 9 is a block diagram illustrating the second voltage generating circuit 42, the third voltage generating circuit 43, and a short circuit 83 that connects the second voltage generating circuit 42 and the third voltage generating circuit 43. Referring to FIG. 9, the second voltage generating circuit 42 includes a limiter circuit 53 and the charge pump 51. The limiter circuit 53 includes a comparator 80 and resistive elements 81 and 82. At the node N5, the resistive elements 81 and 82 divide a potential at a node N7. That is, one end of the resistive element 81 is connected to the node N7, and the other end is connected to one end of the resistive element 82 through the node N5. The other end of the resistive element 82 is grounded. It is assumed that VM1 is a voltage at the node N5. The comparator 80 compares, for example, a reference voltage VREF generated by the BGR circuit with the voltage VM1 at the node N5, and the comparator 80 supplies the comparison result as the "L"-level or "H"-level signal to a node N6. When the potential at the node N5 is lower than the reference voltage VREF, the comparator 80 supplies the "H" level to order the charge pump 51 to boost the potential at the node N7. That is, the comparator 80 supplies the "H"-level signal to the charge pump 51 until the potential at the node N7 reaches 10 V.

On the other hand, when the potential at the node N5 is higher than the reference voltage VREF, the comparator 80 supplies the "L"-level signal to order the charge pump 51 to stop pumping. That is, when the potential at the node N7 reaches 10 V, the comparator 80 supplies the "L"-level signal to the charge pump 51. The output from the charge pump 51 is transferred to the word line WL driver through the node N7.

The short circuit 83 includes an n-channel type MOS transistor 85 and a p-channel type MOS transistor 84. The "L"-level or "H"-level signal is fed from the comparator 80 into the gate of the MOS transistor 85. An inversion signal of the signal fed into the gate of the MOS transistor 85 is fed into the gate of the MOS transistor 84. Until the potential at the node N7 reaches 10 V, the "H"-level signal is fed into the gate of the MOS transistor 85, and the "L"-level signal is fed into the gate of the MOS transistor 84. Thereby, the node N7 and the node N8 are shorted.

When the potential at the node N7 reaches 10 V, the "L"-level signal is fed into the gate of the MOS transistor 85, and the "H"-level signal is fed into the gate of the MOS transistor 84. Thereby, the MOS transistors 84 and 85 are turned off to electrically separate the nodes N7 and N8 from each other. The third voltage generating circuit 43 transfers the voltage VERA to the well driver 7 through the node N8. After the nodes N7 and N8 are electrically separated, the third voltage generating circuit 43 transfers the voltage VERA to the well region, and the well region reaches 13 V.

Effect of First Modification

In the nonvolatile semiconductor memory of the modification of the second embodiment, the following effect can further be obtained in addition to the effects (1) and (2) of the first and second embodiments. The effect of the modification of the second embodiment will be described below.

(3) The false erase of data can be prevented (part 1).

In the nonvolatile semiconductor memory of the first modification, the output terminal of the second voltage generating circuit 42 and the output terminal of the third voltage generating circuit 43 are connected by the short circuit 83. The short circuit 83 electrically shorts the nodes N7 and N8 until the voltage VPASS supplied from the second voltage generating circuit 42 and the voltage VERA supplied from the third voltage generating circuit 43 reach 10 V. That is, in writing the data, the rising characteristics of the voltage VERA transferred to the well region is equalized with the rising characteristics of the voltage VPASS transferred to the non-selection block word line WL. For this reason, the potential difference is not generated among the control gate 107, the n-type well region 101, and p-type well region 102. In the conventional technique, the data accumulated in the memory cell transistor MT is possibly erased when the voltage difference of 3 V or more is generated between the rising characteristics of the voltage VPASS generated by the second voltage generating circuit 42 and the rising characteristics of the voltage VERA generated by the third voltage generating circuit 43. On the other hand, in the nonvolatile semiconductor memory of the modification, the rising characteristics of the voltage VPASS and the rising characteristics of the voltage VERA are identical to each other, and the voltage VPASS and the voltage VERA reach 10 V without generating the voltage difference as described above, so that the false erase can be prevented in the memory cell transistor MT.

Third Embodiment

A nonvolatile semiconductor memory according to a third embodiment of the invention will be described below. The nonvolatile semiconductor memory of the third embodiment differs from the nonvolatile semiconductor memory of the second embodiment in that the time the well driver 7 applies the voltage VERA to the well region is set after the word line WL is set to, for example, 10 V. In the third embodiment, the voltage VPASS of, for example, 10 V is transferred to the non-selection word line WL, and the voltage VPGM transferred to the selection word line WL is set to 10 V while the well region is set to 0 V. At the same time as the voltage VERA is boosted, the voltage VPGM maintained, for example, at 10 V is boosted, for example, to 20 V. The write operation performed by the nonvolatile semiconductor memory of the third embodiment will be described with reference to FIG. 10. FIG.

10 is a timing chart illustrating the potentials at the selection and non-selection word lines WL, the potentials at the n-type well region 101 and p-type well region 102, the potential at the source line SL, the potential at the bit line BL, the signal SGD1 and signal SGS1, and the signal SGD1 and signal SGS1 of the non-selection block BLK. Because the operation of the non-selection bit line BL is identical to the "1"-data write in the selection bit line BL, description thereof is omitted. The description of the same operation as the first and second embodiments is omitted. It is assumed that the word line WL32 is the selection word line WL of the write target memory cell transistor MT, and that the word line WL31 is the non-selection word line WL to which the voltage VISO is transferred.

("1" Data Write)

As illustrated in FIG. 10, because the write operation is not started before a time t0, the potentials at the word line WL, the n-type well region 101, and the p-type well region 102 are set to the voltage VSS (for example, 0 V). The source line SL, the bit line BL, the select signal line SGD1, and the select signal line SGS1 are set to the high-impedance state. That is, the MOS transistors 10 and 11 are turned off to open the source line SL and the bit line BL. The MOS transistors 31 and 32 connected to the select signal lines SGD1 and SGS1 are turned off to open the select signal lines SGD1 and SGS1. The select signal lines SGD1 and SGS1 of the non-selection block BLK are also set to the high-impedance state.

At the time t0, in order to start the data write, the voltage VPGM, the voltage VISO, and the voltage VPASS are transferred to the selection word line WL32, the non-selection word line WL31, and the non-selection word lines WL0 to WL30 and WL33 to WL63, respectively. The voltage VPGM is maintained at the same value as the voltage VPASS of 10 V until a time t1. The voltage VISO is also boosted to, for example, 10 V. Therefore, the channel is formed in the memory cell transistor MT, and the channel is set to the floating state. In forming the channel, the potential at the channel is set to 5 V when a capacitance formed between the charge accumulation layer 105 and the gate electrode 107 and a capacitance formed between the gate electrode 107 and the collection of the n-type well region 101, p-type well region 102, and channels formed in the memory cell transistor MT. Similarly the $n^+$-type impurity diffused layer 103 is set to 5 V.

At a time t1, the potential at the n-type well region 101 and p-type well region 102 are set to the voltage Vint, that is, the forward bias is generated between p-type well region 102 and the $n^+$-type impurity diffused layer 103. By this structure, the channel and the $n^+$-type impurity diffused layer 103 are charged to voltage Vint in addition to 5 V. Accordingly, the potential at the channel is set to (5 V+voltage Vint). At the time t1, the voltage VPGM is boosted to, for example, 20 V.

At a time t2, the potentials at the n-type well region 101 and p-type well region 102 are set to the voltage VSS. By this, the channels of the memory cell transistors MT corresponding to the non-selection word line WL31 are eliminated, the channels are divided into the channels formed in the memory cell transistors MT corresponding to the non-selection word lines WL0 to WL30 and the channels formed in the memory cell transistors MT corresponding to the selection word line WL32 and non-selection word lines WL33 to 63. Because the operations after a time t3 are similar to the timing chart of FIG. 8 in the second embodiment, the description is omitted. Because the "0"-data write operation is identical to the write operation in the first embodiment, description thereof is omitted.

Effect of Third Embodiment

In the nonvolatile semiconductor memory of the third embodiment, the following effect can further be obtained in addition to the effects (1) to (3) obtained in the first and second embodiments and the modification. The effect of the third embodiment will be described below.

(4) The false data erase can be prevented (part 2).

In the nonvolatile semiconductor memory of the third embodiment, in writing the data, the $n^+$-type impurity diffused layer 103 is not charged to a predetermined potential, but the voltage VPGM, the voltage VPASS, and the voltage VISO are transferred to the word line WL to form the channel in the NAND string 11. At this point, when the voltage VPGM is boosted to 20 V while the well region is set to 0 V, the "0" data is written. Therefore, the voltage VPGM is boosted to about 10 V to form the channel, and the potential at the channel is maintained at a predetermined potential. Then, the well driver 7 charges the $n^+$-type impurity diffused layer 103 to the voltage Vint. Accordingly, the voltage VPGM, the voltage VPASS, and the voltage VISO are transferred to the word line WL even if the high voltage is applied to the well region, so that the false erase of data can be prevented.

Second Modification

A nonvolatile semiconductor memory according to a modification of the third embodiment will be described below. The nonvolatile semiconductor memory of the modification of the third embodiment differs from the nonvolatile semiconductor memory of the third embodiment in the following point. That is, the voltage VDD (for example, 1.8 V) is transferred from the bit line BL to the NAND string 11 to boost the potential at the channel to the voltage VDD while the voltage VPGM transferred to the selection word line WL32 is boosted to, for example, 20 V, and then the voltage VERA is imparted to the n-type well region 101 and p-type well region 102 to charge the $n^+$-type impurity diffused layer 103. The operation of the nonvolatile semiconductor memory of the modification of the third embodiment will be described with reference to FIG. 11.

(Operation of Nonvolatile Semiconductor Memory)

The "1"-data and "0"-data write operation in the selection bit line BL of the NAND-type flash memory will be described with reference to FIG. 11. FIG. 11 is a timing chart illustrating the potentials at the selection and non-selection word lines WL, the potentials at the n-type well region 101 and p-type well region 102, the potential at the source line SL, the potential at the bit line BL, the signal SGD1 and signal SGS1, and the signal SGD1 and signal SGS1 of the non-selection block BLK. Because the operation in the non-selection bit line BL is identical to the "1"-data write in the selection bit line BL, description thereof is omitted. The description of the same operation as the first to third embodiments is omitted.

("1" Data Write)

At a time t0, in order to start the data write, the voltage VPASS, the voltage VISO, and the voltage VPGM are transferred to the non-selection word line WL and the selection word line WL, thereby forming the channels in the NAND string 11. The signal SGD1 is set to the "H" level, that is, the voltage VDD. Therefore, the selection transistor ST1 is turned on to transfer the voltage VDD from the sense amplifier 4 through the bit line BL to the channels formed in the NAND string 11. That is, the channels formed at the time t0 are charged to the voltage VDD. At this point, the potentials at the n-type well region 101 and p-type well region 102 are set to the voltage VSS, that is, 0 V. The signal SGS1 is set to the high-impedance state. That is, the select signal line SGS1 is opened. Similarly the select signal lines SGD1 and SGS1 corresponding to the non-selection block BLK are opened. The source line SL is also set to the high-impedance state. The potential at the channel is boosted by the coupling to the word line WL, and the potential at the channel is set to (voltage VDD+boost voltage), thereby cutting off the selection transistor ST1.

At a time t1, the bit line BL is set to the high-impedance state. That is, the MOS transistor 9 connected to the bit line BL is turned off to open the bit line BL. Similarly, the select signal line SGD1 is set to the high-impedance state, thereby turning off the selection transistor ST1. Then the well driver 7 transfers the voltage VERA to the n-type well region 101 and the p-type well region 102. By doing this, the forward bias is applied between the potentials at the p-type well region 102 and the $n^+$-type impurity diffused layer 103, which allows the voltage Vint to be additionally charged in the channel already set to the voltage (VDD+boost potential). At a time t2, the well driver 7 sets the potentials at the n-type well region 101 and p-type well region 102 to the voltage VSS, that is, 0 V. The voltage VISO transferred to the non-selection block word line WL32 is set to the voltage VSS, that is, 0 V. Therefore, the non-selection block word lines WL33 to 63 are electrically separated from the selection word line WL31 and non-selection block word lines WL30 to WL0. Because other operations are identical to those of FIG. 10, description thereof is omitted. Because the "0"-data write operation is identical to the write operation of the first embodiment, description thereof is omitted.

Effect of Second Modification

The effect similar to the effect (4) can be obtained even in the nonvolatile semiconductor memory of the modification of the third embodiment. Even if the voltage VPGM at the selection word line WL is boosted to 20 V before the well driver 7 transfers the voltage VERA to the well region, the false data write can be prevented such that the sense amplifier 4 transfers the voltage VDD to the NAND string 11. The voltage VPGM, the voltage VPASS, and the voltage VISO are transferred to the word line WL even if the high voltage is applied to the well region, so that the false data erase can be prevented.

Fourth Embodiment

A nonvolatile semiconductor memory according to a fourth embodiment of the invention will be described below. The nonvolatile semiconductor memory of the fourth embodiment differs from the nonvolatile semiconductor memories of the first to third embodiments in that the voltages applied to gates of the MOS transistor 9 connected to the bit line BL and the MOS transistor 10 connected to the source line SL are set to the voltage VDD or less. Therefore, the bit line BL and the source line SL are maintained at the voltage Vint, thereby improving cutoff characteristics of the MOS transistors ST1 and ST2 to prevent the false data write.

(Write Operation of NAND-Type Flash Memory)

Figure 12:
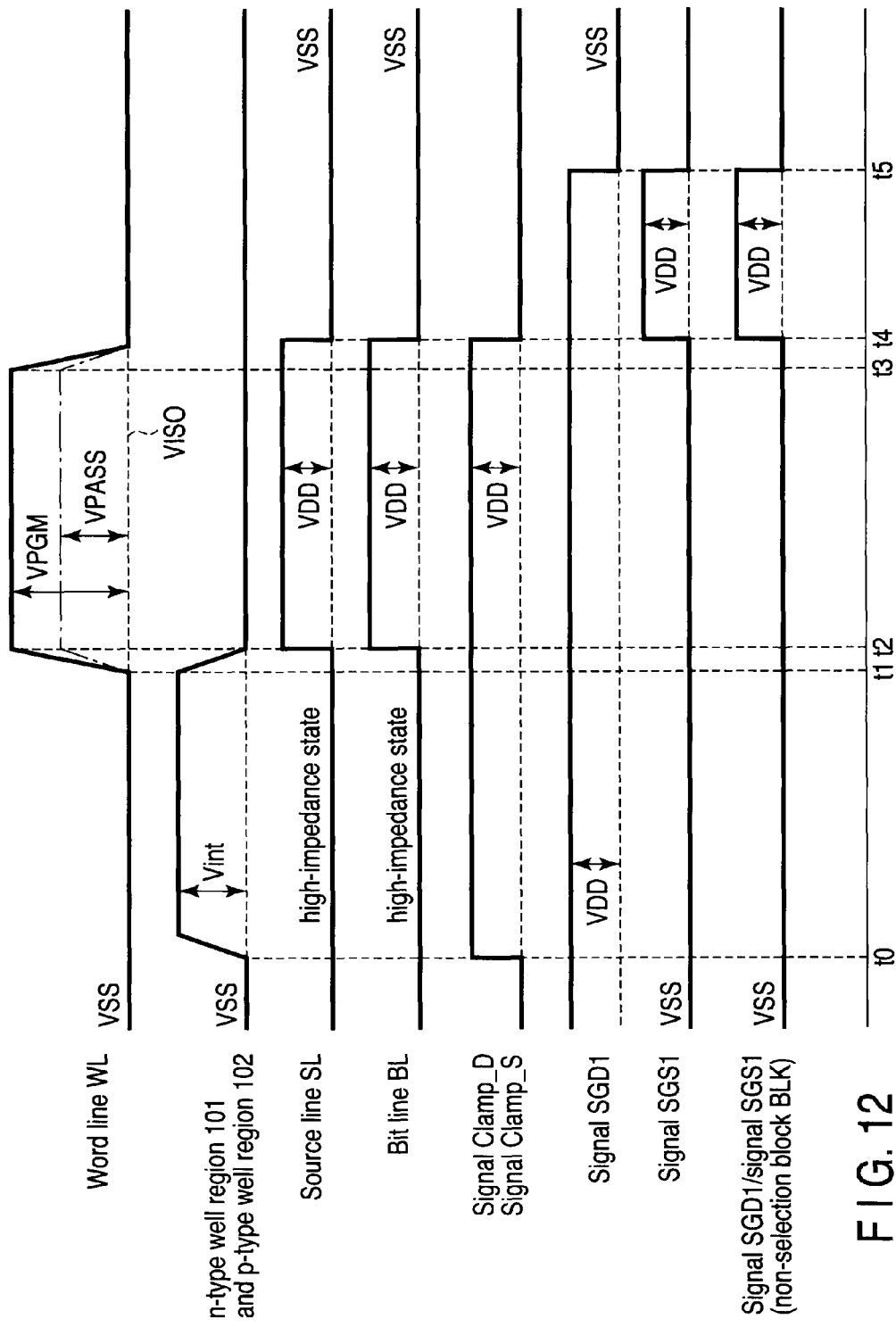
FIG. 12 is a timing chart illustrating a potential at a word line WL, a potential at a well region, and a potential at a signal line in a write operation of a NAND-type flash memory according to a fourth embodiment of the invention.

The "1"-data and "0"-data write operation in the selection bit line BL of the NAND-type flash memory will be described with reference to FIG. 12. FIG. 12 is a timing chart illustrating the potentials at the selection and non-selection word lines WL, the potentials at the n-type well region 101 and p-type well region 102, the potential at the source line SL, the potential at the bit line BL, the signal Clamp_D, the signal Clamp_S, the signal SGD1, the signal SGS1, and the signal SGD1 and signal SGS1 of the non-selection block BLK. Because the operation in the non-selection bit line BL is identical to the "1"-data write in the selection bit line BL, description thereof is omitted. The description of the same operation as that of the first embodiment is omitted.

("1" Data Write)

At a time t0, the signal Clamp_D is set to the voltage VDD or less (for example, 0 V). The signal Clamp_D is imparted to the gates of the MOS transistors 9 connected to the non-selection bit line BL and selection bit line BL in which the "1" data is written. The signal Clamp_S is set to the voltage VDD or less (for example, 0 V). The signal Clamp_S is imparted to the gates of the MOS transistors 10 and 12 connected to the source line SL. That is, the bit line BL and the source line SL are set to the high-impedance state. The well driver 7 charges the $n^+$-type impurity diffused layer 103 to the voltage Vint. The voltage Vint to which the $n^+$-type impurity diffused layer 103 is charged is transferred to the bit line BL and the source line SL, and the bit line BL and the source line SL are maintained at the voltage Vint. Accordingly, because the signal SGD1 is set to the "H" level, that is, the voltage VDD, the selection transistor ST1 is cut off. Then the sense amplifier 4 transfers the voltage VDD to maintain the MOS transistor 9 at the cutoff state. As the operations from a time t1 are similar to those of FIG. 6 in the first embodiment, description thereof is omitted. The "0"-data write operation in the memory cell transistor MT corresponding to the selection bit line BL is identical to that of the first embodiment, thus description thereof is omitted.

Effect of Fourth Embodiment

In the nonvolatile semiconductor memory of the fourth embodiment, the following effect can be obtained in addition to the effects (1) to (4):

(5) The cutoff characteristics can be improved in the selection transistor ST1 and ST2.

In the nonvolatile semiconductor memory of the fourth embodiment, the voltages applied to the gates of the MOS transistor 9 connected to the bit line BL and to the gates of the MOS transistor 10 and 12 connected to the source line SL are set to the voltage VDD or less. The voltage Vint of, for example, 3 V is transferred to the bit line BL through the contact plug CP1 from the $n^+$-type impurity diffused layer 103 that acts as the drain of the selection transistor ST1. At this point, because the voltage Vint is higher than the voltage applied to the gate of the MOS transistor 9, the MOS transistor 9 is cut off. That is, the bit line BL is maintained at the voltage Vint, and the voltage VDD that is lower than the voltage Vint is applied to the gate of the selection transistor ST1, thereby cutting off the selection transistor ST1.

Similarly, the voltage Vint of, for example, 3 V is transferred to the source line SL through the contact plug CP2 from the $n^+$-type impurity diffused layer 103 that acts as the source of the selection transistor ST2. At this point, because the voltage Vint is higher than the voltage applied to the gate of the MOS transistor 10 and 12, the MOS transistor 10 and 12 is cut off. That is, the source line SL is maintained at the voltage Vint, and the voltage VSS is applied to the gate of the selection transistor ST2, thereby cutting off the selection transistor ST2.

The bit line BL and the source line SL are maintained at the voltage VERA of 3 V, generated by the well driver 7, which is higher than the voltage VDD through the $n^+$-type impurity diffused layer 103 and the contact plugs CP1 and 2. Therefore, the cutoff characteristics of the selection transistors ST1 and ST2 are improved compared with the conventional case in which the voltage VDD is transferred from the sense amplifier 4 to the NAND string 11. In the conventional technique, the potential at the bit line BL is set to the voltage VDD in writing the "1" data, and the voltage VDD is applied to the gate of the selection transistor ST1. Therefore, the potential difference between the gate and source of the selection transistor ST1 becomes 0 V. On the other hand, in the nonvolatile semiconductor memory of the fourth embodiment, because the potential difference between the gate and source of the selection transistor ST1 becomes the reverse bias of voltage (Vint−VDD), the cutoff characteristic of the selection transistor ST1 is improved. The same holds true for the selection transistor ST2. The means of the fourth embodiment for applying the voltage VDD or less to the gates of the MOS transistors 9 and 10 and 12 to improve the cutoff characteristics of the selection transistors ST1 and ST2 can be combined with the nonvolatile semiconductor memories of the first to third embodiments. For example, in the second embodiment, the well driver 7 applies the voltage VERA of 13 V to the n-type well region 101 and p-type well region 102, thereby charging the n$^+$-type impurity diffused layer 103 with the voltage Vint of 13 V. When the bit line BL and the source line SL are maintained at the potential of 13 V, the cutoff characteristics of the selection transistors ST1 and ST2 can be further improved, and the boost characteristics of the NAND string 11 are also improved. That is, the false data write can be prevented.

(1) A method of controlling a nonvolatile semiconductor memory of the embodiment includes:

a step in which a first voltage generating circuit (well driver 7) transfers a first voltage (VERA) to an active region (101, 102), a memory cell transistor being formed in the active region (101, 102), the memory cell transistor including a charge accumulation layer (105), a control gate (107), and a first impurity diffused layer (103) that acts as a source and a drain;

a step of forming a forward bias between the active region (101, 102) and the first impurity diffused layer (103) to charge the first impurity diffused layer (103) to a first voltage (Vint);

a step in which the first voltage generating circuit (well driver 7) stops the transfer of first voltage (VERA); and a step in which a second voltage generating circuit (41, 42) applies a second voltage (VPASS) to the control gate (107) of the memory cell transistor that is not a write target while the first impurity diffused layer (103) is maintained at the first voltage (Vint) and applies a third voltage (VPGM) that is higher than the second voltage (VPASS) to the control gate (107) of the memory cell transistor that is the write target to write data in the memory cell transistor that is the write target.

(2) A method of controlling a nonvolatile semiconductor memory according to the embodiment includes:

a step in which a first voltage generating circuit (well driver 7) transfers a first voltage (VERA) to an active region (101, 102), a memory cell transistor being formed in the active region (101, 102), the memory cell transistor including a charge accumulation layer (105), a control gate (107), and a first impurity diffused layer (103) that acts as a source and a drain, a second voltage generating circuit applies a second voltage (VPASS) to the control gate (107) of the memory cell transistor that is not a write target while the first impurity diffused layer (103) is charged to a first voltage (Vint), and a third voltage (VPGM) is applied to the control gate (107) of the memory cell transistor that is the write target;

a step in which the first voltage generating circuit (well driver 7) stops the transfer of the first voltage; and a step of writing data in the memory cell transistor that is the write target by the third voltage after the transfer of the first voltage is stopped.

(3) In (2) of the method of controlling the nonvolatile semiconductor memory of the embodiment, during the data write, a short circuit (84) shorts a first output terminal of a first voltage generating circuit (43) and a second output terminal to which a second voltage generating circuit (42) supplies the second voltage.

(4) A method of controlling a nonvolatile semiconductor memory of the embodiment includes:

a step in which, while a channel is charged to a first voltage (voltage VDD) from a bit line BL electrically connected to a drain (103) of a first MOS transistor (ST1) formed in an active region, the first MOS transistor (ST1) including a first gate electrode (107) and a first impurity diffused layer (103) that acts as a source and a drain, a first voltage generating circuit (42) applies a second voltage (VPASS) to a control gate (107) of a memory cell transistor that is not a write target to impart a third voltage (VPGM) to the control gate (107) of a memory cell transistor that is the write target in memory cell transistors formed in the active region, each of the memory cell transistors including a charge accumulation layer (105), the control gate (107), and the second impurity diffused layer (103), the second impurity diffused layer (103) acting as a source and a drain, the third voltage (VPGM) being higher than a second voltage;

a step in which a second voltage generating circuit (43) charges the first and second impurity diffused layer (103) to a fourth voltage (Vint);

a step in which the second voltage generating circuit (43) stops the transfer of the fourth voltage (VERA); and a step of writing data in the memory cell transistor that is the write target by the third voltage (VPGM) after the transfer of the fourth voltage (VERA) is stopped.

(5) In (1) to (3) indicated above, the method of controlling the nonvolatile semiconductor memory of the embodiment includes:

a step of applying a fifth voltage (voltage VDD or less) to gates of a third MOS transistor (9) and a fourth MOS transistor (10), the fifth voltage being lower than the first voltage (Vint), the third MOS transistor (9) being formed in the active region and including a first gate electrode (107) and a second impurity diffused layer (103) that acts as a source and a drain, the third MOS transistor (9) being connected to a bit line BL through a drain (103) of a first MOS transistor (ST1) whose source is commonly connected to the drain of the memory cell transistor, the fourth MOS transistor (10) including a second gate electrode (107) and a third impurity diffused layer (103) that acts as a source and a drain, the fourth MOS transistor (10) being connected to a source line SL through a source of a second MOS transistor (ST2) whose drain is commonly connected to the source of the memory cell transistor; and a step of turning off the MOS transistors 9 and 10 to maintain the bit line BL and the source line SL at the first voltage (Vint) and cutting off the first and second MOS transistors (ST1, ST2).

The memory cell transistor MT may be an FG type. In the case of the FG type, the laminated gate includes a charge accumulation layer (floating gate: conductive layer) and a control gate. The charge accumulation layer is formed on the semiconductor substrate with a gate insulator film interposed therebetween. The control gate is formed on a floating gate with an inter-gate insulator film interposed therebetween. It is not always necessary that the fourth voltage generating circuit 44 transfer the voltage VISO to the word line WL that is adjacent to the source side of the memory cell transistor MT corresponding to the write-target word line WL. The data write is sequentially performed from the memory cell transistor MT on the side of the selection transistor ST2, and at least a memory cell transistor MT corresponding to the word line WL0 may be turned off except for the memory cell transistor MT corresponding to the word line WL1 that is the target of the data write.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell transistor which includes a charge accumulation layer, a control gate, and a first impurity diffused layer, the charge accumulation layer being formed on an active region, the first impurity diffused layer acting as a source and a drain;
a first MOS transistor which is formed on the active region, the first MOS transistor including a first gate electrode and a second impurity diffused layer, the second impurity diffused layer acting as a drain and a source, the source being commonly connected to the drain of the memory cell transistor;
a second MOS transistor which is formed on the active region, the second MOS transistor including a second gate electrode and a third impurity diffused layer, the third impurity diffused layer acting as a drain and a source, the drain being commonly connected to the source of the memory cell transistor;
a first voltage generating circuit which applies a first voltage to the active region to generate a forward bias between the active region and the first to third impurity diffused layers; and
a second voltage generating circuit which applies a second voltage to the control gate of the memory cell transistor which is not a write target, the second voltage generating circuit applying a third voltage to the control gate of the memory cell transistor which is the write target, the third voltage being higher than the second voltage,
after the first voltage generating circuit charges the first to third impurity diffused layer to the first voltage, the second voltage generating circuit applying the second voltage and the third voltage to the control gate of the memory cell transistor while the active region is grounded, thereby forming channels in the memory cell transistor and the first and second MOS transistors,
after the channels are formed, the first MOS transistor and the second MOS transistor being cut off to set the formed channels to a floating state.

2. The memory according to claim 1, further comprising:
a bit line which is electrically connected to the second impurity diffused layer;
a third MOS transistor in which one end of a current pathway is connected to the bit line; and
a fourth MOS transistor in which one end of a current pathway is connected to a source line electrically connected to the source of the second MOS transistor,
wherein a fourth voltage which is lower than the first voltage is applied to the gates of the third and fourth MOS transistors to maintain the bit line and the source line at the first voltage, thereby cutting off the first and second MOS transistors.

3. The memory according to claim 1, wherein the third voltage is necessary to inject an electron in the charge accumulation layer, and the second voltage is necessary to turn on the memory cell.

4. The memory according to claim 1, further comprising:
a first level shifter circuit;
a third MOS transistor in which one end of a current pathway is connected to the active region, the first level shifter circuit turning on the third MOS transistor;
a second level shifter circuit; and
a fourth MOS transistor in which one end of a current pathway is connected to the active region, the second level shifter circuit turning on the fourth MOS transistor,
wherein the third MOS transistor grounds the active region when the third MOS transistor is turned on, and the first voltage generating circuit applies the first voltage to the active region through the fourth MOS transistor when the fourth MOS transistor is turned on.

5. The memory according to claim 4, wherein the first level shifter turns on the third MOS transistor after the second level shifter switches the fourth MOS transistor from the on state to the off state.

6. A nonvolatile semiconductor memory comprising:
a memory cell transistor which includes a charge accumulation layer, a control gate, and a first impurity diffused layer, the charge accumulation layer being formed on an active region, the first impurity diffused layer acting as a source and a drain;
a first MOS transistor which is formed on the active region, the first MOS transistor including a first gate electrode and a second impurity diffused layer, the second impurity diffused layer acting as a drain and a source, the source being commonly connected to the drain of the memory cell transistor;
a second MOS transistor which is formed on the active region, the second MOS transistor including a second gate electrode and a third impurity diffused layer, the third impurity diffused layer acting as a source and a drain, the drain being commonly connected to the source of the memory cell transistor;
a first voltage generating circuit which applies a first voltage to the active region to generate a forward bias between the active region and the first to third impurity diffused layer; and
a second voltage generating circuit which applies a second voltage to the control gate of the memory cell transistor which is not a write target, the second voltage generating circuit applying a third voltage to the control gate of the memory cell transistor which is the write target, the third voltage being higher than the second voltage, the second voltage generating circuit applying the second voltage and the third voltage to the control gate of the memory cell transistor while the first voltage generating circuit charges the first to third impurity diffused layer to the first voltage, thereby forming channels in the memory cell transistor and the first and second MOS transistors, the first MOS transistor and the second MOS transistor being cut off after the channels are formed, thereby setting the formed channels to a floating state.

7. The memory according to claim 6, further comprising:
a bit line which is electrically connected to the second impurity diffused layer;
a third MOS transistor in which one end of a current pathway is connected to the bit line; and
a fourth MOS transistor in which one end of a current pathway is connected to a source line electrically connected to the source of the second MOS transistor, wherein a fourth voltage which is lower than the first voltage is applied to the gates of the third and fourth MOS transistors to maintain the bit line and the source line at the first voltage, thereby cutting off the first and second MOS transistors.

8. The memory according to claim 6, further comprising a short circuit which shorts a first output terminal and a second output terminal during data write, the first voltage generating circuit supplying the first voltage to the first output terminal, the second voltage generating circuit supplying the second voltage to the second output terminal.

9. The memory according to claim 8, further comprising:
a bit line which is electrically connected to the second impurity diffused layer;
a third MOS transistor in which one end of a current pathway is connected to the bit line; and
a fourth MOS transistor in which one end of a current pathway is connected to a source line electrically connected to the source of the second MOS transistor,
wherein a fourth voltage which is lower than the first voltage is applied to the gates of the third and fourth MOS transistors to maintain the bit line and the source line at the first voltage, thereby cutting off the first and second MOS transistors.

10. The memory according to claim 6, wherein the third voltage is necessary to inject an electron in the charge accumulation layer, and the second voltage is necessary to turn on the memory cell transistor.

11. The memory according to claim 6, further comprising:
a first level shifter circuit;
a third MOS transistor in which one end of a current pathway is connected to the active region, the first level shifter circuit turning on the third MOS transistor;
a second level shifter circuit; and
a fourth MOS transistor in which one end of a current pathway is connected to the active region, the second level shifter circuit turning on the fourth MOS transistor,
wherein the third MOS transistor grounds the active region when the third MOS transistor is turned on, and the first voltage generating circuit applies the first voltage to the active region through the fourth MOS transistor when the fourth MOS transistor is turned on.

12. The memory according to claim 11, wherein the first level shifter turns on the third MOS transistor after the second level shifter switches the fourth MOS transistor from the on state to the off state.

13. A nonvolatile semiconductor memory comprising:
a memory cell transistor which includes a charge accumulation layer, a control gate, and a first impurity diffused layer, the charge accumulation layer being formed on an active region, the first impurity diffused layer acting as a source and a drain;
a first MOS transistor which is formed on the active region, the first MOS transistor including a first gate electrode and a second impurity diffused layer, the second impurity diffused layer acting as a drain and a source, the source being commonly connected to the drain of the memory cell transistor;
a second MOS transistor which is formed on the active region, the second MOS transistor including a second gate electrode and a third impurity diffused layer, the third impurity diffused layer acting as a source and a drain, the drain being commonly connected to the source of the memory cell transistor;
a first voltage generating circuit which applies a second voltage to the control gate of the memory cell transistor which is not a write target during data write while applying a third voltage to the control gate of the memory cell transistor which is the write target, thereby forming channels in the memory cell transistor and the first and second MOS transistors; and
a second voltage generating circuit which applies a first voltage to the active region during data write while the channels are set to a floating state, thereby generating a forward bias between the active region and the first to third impurity diffused layers.

14. The memory according to claim 13, wherein, after the first voltage generating circuit applies the second voltage and the third voltage to the memory cell transistor, the first voltage generating circuit increases the third voltage to be higher than the second voltage while the second voltage generating circuit applies the first voltage to the active region.

15. The memory according to claim 14, further comprising:
a bit line which is electrically connected to the second impurity diffused layer;
a third MOS transistor in which one end of a current pathway is connected to the bit line; and
a fourth MOS transistor in which one end of a current pathway is connected to a source line electrically connected to the source of the second MOS transistor,
wherein a fourth voltage which is lower than the first voltage is applied to the gates of the third and fourth MOS transistors to maintain the bit line and the source line at the first voltage, thereby cutting off the first and second MOS transistors.

16. The memory according to claim 13, further comprising a bit line electrically connected to the second impurity diffused layer,
wherein the first voltage generating circuit applies the third voltage to the control gate of the memory cell transistor while the channel is charged to a fourth voltage from the bit line, thereby setting the channels to the floating state, the third voltage being higher than the second voltage, and
the second voltage generating circuit charges the first to third impurity diffused layers to the first voltage.

17. The memory according to claim 16, further comprising:
a third MOS transistor in which one end of a current pathway is connected to the bit line; and
a fourth MOS transistor in which one end of a current pathway is connected to a source line electrically connected to the source of the second MOS transistor,
wherein a fourth voltage which is lower than the first voltage is applied to the gates of the third and fourth MOS transistors to maintain the bit line and the source line at the first voltage, thereby cutting off the first and second MOS transistors.

18. The memory according to claim 13, wherein the third voltage is necessary to inject an electron in the charge accumulation layer, and the second voltage is necessary to turn on the memory cell.

19. The memory according to claim 13, further comprising:
a first level shifter circuit;
a third MOS transistor in which one end of a current pathway is connected to the active region, the first level shifter circuit turning on the third MOS transistor;
a second level shifter circuit; and a fourth MOS transistor in which one end of a current pathway is connected to the active region, the second level shifter circuit turning on the fourth MOS transistor, wherein the third MOS transistor grounds the active region when the third MOS transistor is turned on, and the first voltage generating circuit applies the first voltage to the active region through the fourth MOS transistor when the fourth MOS transistor is turned on.

20. The memory according to claim 19, wherein the first level shifter turns on the third MOS transistor after the second level shifter switches the fourth MOS transistor from the on state to the off state.

* * * * *